(12) United States Patent
Chiu et al.

(10) Patent No.: US 12,532,561 B2
(45) Date of Patent: *Jan. 20, 2026

(54) IMAGE SENSOR DEVICE AND MANUFACTURING METHOD THEREOF

(71) Applicant: TAIWAN SEMICONDUCTOR MANUFACTURING CO., LTD., Hsinchu (TW)

(72) Inventors: Wei-Chao Chiu, Hsinchu (TW); Chun-Wei Chang, Tainan (TW); Ching-Sen Kuo, Taipei (TW); Feng-Jia Shiu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/643,860

(22) Filed: Apr. 23, 2024

(65) Prior Publication Data

US 2024/0274637 A1 Aug. 15, 2024

Related U.S. Application Data

(60) Continuation of application No. 17/871,985, filed on Jul. 25, 2022, now Pat. No. 11,996,432, which is a (Continued)

(51) Int. Cl.
*H10F 39/00* (2025.01)
*G03F 7/09* (2006.01)

(52) U.S. Cl.
CPC ......... *H10F 39/807* (2025.01); *H10F 39/024* (2025.01); *H10F 39/026* (2025.01); *H10F 39/803* (2025.01); *G03F 7/094* (2013.01)

(58) Field of Classification Search
CPC .................... H10F 39/807; H10F 71/133
See application file for complete search history.

(56) References Cited

U.S. PATENT DOCUMENTS

| | | | |
|---|---|---|---|
| 8,796,666 | B1 | 8/2014 | Huang |
| 9,012,132 | B2 | 4/2015 | Chang |

(Continued)

FOREIGN PATENT DOCUMENTS

| | | |
|---|---|---|
| CN | 109449079 A | 3/2019 |
| TW | 201027592 A | 7/2010 |

(Continued)

*Primary Examiner* — David A Zarneke
(74) *Attorney, Agent, or Firm* — Maschoff Brennan

(57) ABSTRACT

A method includes performing a first lithography process using a first pattern of a first photomask to form a first photoresist pattern on a front side of a device substrate; performing a first implantation process using the first pattern as a mask to form first isolation regions in the device substrate; after performing the first implantation process, performing a second lithography process using a second pattern of a second photomask to form a second photoresist pattern on the front side of the device substrate, the second pattern being shifted from the first pattern by a distance less than the first pitch and in the first direction; performing a second implantation process using the second photoresist pattern as a mask to form second isolation regions in the device substrate and spaced apart from the first isolation regions; and forming pixels between the first and second isolation regions.

20 Claims, 29 Drawing Sheets

Related U.S. Application Data division of application No. 16/818,848, filed on Mar. 13, 2020, now Pat. No. 11,411,033.

(60) Provisional application No. 62/951,966, filed on Dec. 20, 2019.

(56) References Cited

U.S. PATENT DOCUMENTS

| | | |
|---|---|---|
| 9,028,915 B2 | 5/2015 | Chang |
| 9,093,530 B2 | 7/2015 | Huang |
| 9,146,469 B2 | 9/2015 | Liu |
| 9,213,234 B2 | 12/2015 | Chang |
| 9,223,220 B2 | 12/2015 | Chang |
| 9,256,133 B2 | 2/2016 | Chang |
| 9,536,759 B2 | 1/2017 | Yang |
| 9,548,303 B2 | 1/2017 | Lee |
| 10,090,357 B2 * | 10/2018 | Chiu ................ H10F 39/811 |
| 10,121,811 B1 * | 11/2018 | Chiu ................ H10F 39/026 |
| 10,186,542 B1 | 1/2019 | Chiu et al. |
| 10,546,889 B2 | 1/2020 | Chang |
| 10,734,436 B2 * | 8/2020 | Chiu ................ G03F 7/405 |
| 11,329,089 B1 | 5/2022 | Ma |
| 11,532,662 B2 | 12/2022 | Wei et al. |
| 2010/0068654 A1 | 3/2010 | Fonseca et al. |
| 2019/0027530 A1 | 1/2019 | Chang et al. |

FOREIGN PATENT DOCUMENTS

| | | |
|---|---|---|
| TW | 201606933 A | 2/2016 |
| TW | 201909250 A | 3/2019 |
| TW | 201913986 A | 4/2019 |
| TW | 201919214 A | 5/2019 |

* cited by examiner

M

```
Perform a first lithography process using a first pattern of a first
photomask to form first photoresist columns on a front side of a     ~S12
                        device substrate
                               ↓
Perform a first ion implantation process using the first photoresist
columns as a mask to implant first isolation regions in the device    ~S14
                        substrate
                               ↓
    Perform a second lithography process using a second pattern of a
    second photomask to form second photoresist columns on the front  ~S16
                        side of the device substrate
                               ↓
     Perform a second ion implantation process using the second
photoresist columns as a mask to implant second isolation regions in  ~S18
                        the device substrate
                               ↓
Perform a third lithography process using a third pattern of a third
photomask to form third photoresist columns on the front side of the  ~S20
                        device substrate
                               ↓
Perform a third ion implantation process using the third photoresist
columns as a mask to implant third isolation regions in the device    ~S22
                        substrate
```

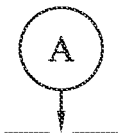

Perform a fourth lithography process using a fourth pattern of a fourth photomask to form fourth photoresist columns on the front side of the device substrate — S24

Perform a fourth ion implantation process using the fourth photoresist columns as a mask to implant fourth isolation regions in the device substrate — S26

Respectively form pixels in the pixel regions of the device substrate — S28

Subsequently form an interconnect structure, a buffer layer, and a carrier substrate on the front side of the device substrate — S30 subsequently form a color filter layer and a micro-lens layer on the back side of the device substrate — S32

Fig. 19B

IMAGE SENSOR DEVICE AND MANUFACTURING METHOD THEREOF

PRIORITY CLAIM AND CROSS-REFERENCE

This application is a continuation application of U.S. application Ser. No. 17/871,985, filed on Jul. 25, 2022, which is a divisional application of U.S. patent application Ser. No. 16/818,848, filed on Mar. 13, 2020, now U.S. Pat. No. 11,411,033, issued on Aug. 9, 2022, which claims priority to U.S. Provisional Application Ser. No. 62/951,966, filed on Dec. 20, 2019, the entirety of which is incorporated by reference herein in their entireties.

BACKGROUND

Image sensor devices are widely used in various imaging applications and products, such as digital still cameras or mobile phone camera applications. These devices utilize an array of sensor elements (pixels) in a substrate. The pixels may be photodiodes or other photosensitive elements that are adapted to absorb light projected toward the substrate and convert the sensed light into electrical signals. To receive higher resolution, it is advantageous to increase the number of the pixels in the image sensor devices.

The ever-shrinking geometry size brings challenges to image sensor device fabrication. For example, the fabrication process may require photoresist masks with high aspect ratio to produce pixels that are micron or sub-micron in size. However, photoresist masks with high aspect ratio are more prone to the effects of capillary forces. These effects are exacerbated as the aspect ratio of the mask increase and/or as the pitch decreases. As a result, photoresist masks may collapse, for example, due to the pulling effect of capillary forces between adjacent photoresist masks.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 19A and 19B are a flow chart illustrating an exemplary method for fabricating an image sensor device according to various embodiments of the present disclosure.

DETAILED DESCRIPTION

Figure 1A:
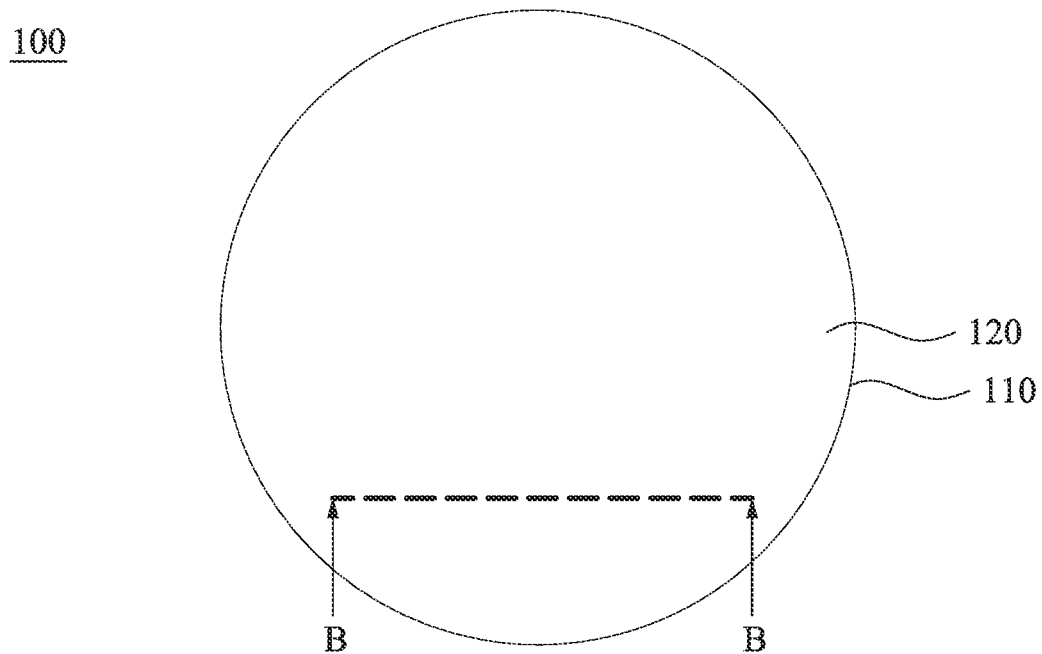
FIGS. 1A-18B illustrate a method for manufacturing an image sensor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Embodiments of the present disclosure provide a method to form isolation regions at sub-micrometer levels for an image sensor device by using plural lithography processes and optional shrinkage material applied to the photoresist columns provided by the lithography processes. The photoresist columns are formed with low aspect ratio and ultra-high aspect ratio trench between the photoresist columns without collapsing the photoresist columns.

Figure 1B:

FIGS. 1A-18B illustrate a method for manufacturing an image sensor device 100 at various stages in accordance with some embodiments of the present disclosure. Reference is made to FIGS. 1A and 1B. FIG. 1A illustrates a simplified top view for manufacturing an image sensor device 100 at various stages in accordance with some embodiments, and FIG. 1B is a cross-sectional view taken along line B-B in FIG. 1A. The image sensor device 100 may be used in various electronic devices for capturing images, such as cameras, cellular telephones, personal digital assistants, computers, etc. Examples of such an image sensor device may include a complementary metal-oxide semiconductor (CMOS) image sensor (CIS) device, a charged-coupled device (CCD), an active-pixel sensor (APS) device, or a passive-pixel sensor device. In some embodiments, the image sensor device 100 is a backside illuminated (BSI) image sensor device. While the present disclosure is described with respect to backside illuminated image sensor devices, the embodiments of the disclosure may also be applied to a front side illuminated (FSI) image sensor device. The image sensor device 100 may be a CIS and includes a device substrate 110. The device substrate 110 is, for example, a bulk substrate of silicon, an epitaxial layer over a silicon substrate, a semiconductor wafer, a silicon germanium substrate, or a silicon-on-insulator (SOI) substrate. Other semiconductor materials including group III, group IV, and group V elements may be used in some embodiments. The device substrate 110 may be undoped in some embodiments. In some other embodiments, the device substrate 110 is doped with a p-type dopant such as boron (i.e., a p-type substrate) or an n-type dopant such as phosphorous or arsenic (i.e., an n-type substrate). The device substrate 110 could optionally include a compound semiconductor and/or an alloy semiconductor. In some embodiments, the device substrate 110 could include an epitaxial layer, which may be strained for performance enhancement.

The device substrate 110 has a front side (also referred to as a front surface) 112 and a back side (also referred to as a back surface) 114 opposing the front side 112. For a BSI image sensor device such as the image sensor device 100, light or radiation is incident upon the back side 114 (after a substrate thinning process) and enters the remaining device substrate 110 through the back side 114. The front side 112 is an active surface on which circuit designs, such as transistor, contact, and interconnection features, will be formed to provide external communication with the pixels in the pixel regions. It is understood that FIGS. 1A-18B and FIGS. 20A-23B have been simplified for a better understanding of the inventive concepts of the present disclosure and therefore may not be drawn to scale.

A first photoresist layer 120 is formed over the front side 112 of the device substrate 110. The first photoresist layer 120 may be formed by depositing (e.g., spin-coating) a photoresist film over the front side 112 of the device substrate 110 and thereafter patterning the photoresist film in a first lithography process, which may involve one or more processes such as exposure, post-exposure bake, developing, etc. The first lithography process may utilize a lithography apparatus to pattern the first photoresist layer 120. The lithography apparatus may include a radiation source to provide radiation energy, a lens system to project radiation energy for lithography patterning, and a mask stage having a scan function. The radiation source may be a suitable light source such as an ultra-violet (UV), deep ultra-violet (DUV), or extreme ultra-violet (EUV) source. For example, the radiation source may include, but is not limited to, a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; a mercury lamp having a wavelength of 436 nm or 365 nm; or other light sources having a wavelength below approximately 100 nm. The lens system may include one or more illumination modules designed to direct radiation beams from the radiation source onto a photomask. The mask stage is operable to secure the photomask and manipulate the photomask in transitional and/or rotational modes. The lithography apparatus also includes a substrate stage for holding and manipulating a substrate to be patterned in transitional and/or rotational modes during the first lithography process. It is understood that the manipulation of the substrate is considered relative to the photomask so that one or both of the mask stage and substrate stage can move to achieve the desired manipulation. An alignment device can be used to align the photomask and the substrate.

Figure 1C:
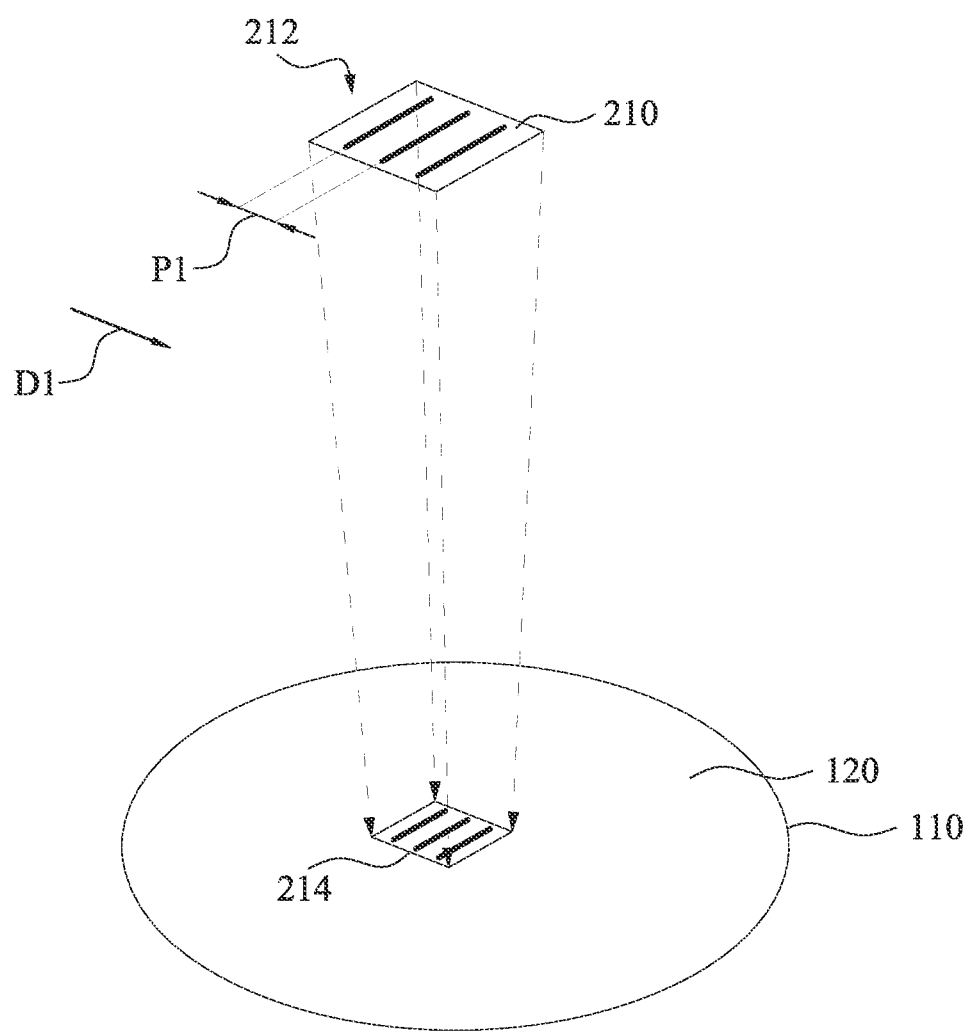

FIG. 1C illustrates a diagrammatic view of a first lithography process being performed to transfer an image onto the first photoresist layer 120 on the device substrate 110 of FIG. 1A in accordance with some embodiments. For simplicity, FIG. 1C shows a portion of the first photoresist layer 120 receiving the image. During the first lithography process, a photomask, such as a first photomask 210 with a first pattern 212 shown in FIG. 1C, is loaded onto the mask stage, and the device substrate 110 is loaded onto the substrate stage. The first pattern 212 may have various features such as lines, holes, grids, or any desired shape such as polygons, depending on the features to be formed in the first photoresist layer 120. In some embodiments, the first pattern 212 has a pattern of substantially parallel lines arranged in a first direction D1. The pattern of substantially parallel lines may be composed of repeating features, for example a plurality of substantially parallel lines. The radiation beam may scan over the first photomask 210. The features of the first pattern 212 allow the radiation beam to pass through and expose a field 214 on the device substrate 110. The field 214 may define at least one edge of a die (or chip). In some embodiments, the field 214 contains one or more pixel array regions defined in the device substrate 110. As such, the first pattern 212 is transferred onto the first photoresist layer 120 at the exposure field 214. The lithography apparatus steps the device substrate 110 to a next field (e.g., one scanning field) to expose another field. This step-and-scan process is performed until a pixel array region of the device substrate 110 is exposed with the first pattern 212. The radiation beam contacts and changes the chemical composition of the first photoresist layer 120 such that a developer can subsequently remove the exposed portions of the first photoresist layer 120.

The pattern of substantially parallel lines has a constant mask pitch at above sub-micrometer levels. In some embodiments, the pattern of substantially parallel lines has a mask pitch P1 greater than about 1 micrometer, such as about 1.15 micrometers to about 3 micrometers, for example about 1.2 micrometers to about 1.9 micrometers. In some embodiments, the pattern of substantially parallel lines has a mask pitch P1 of about 1.8 micrometers. The term "mask pitch" described herein refers to a width of the feature (e.g., line) plus the distance to the next immediately adjacent feature. It is understood that the mask pitch P1 of the first pattern 212 may vary depending on the critical dimension (CD) of the pattern(s) to be formed in the first photoresist layer 120.

Figure 2A:
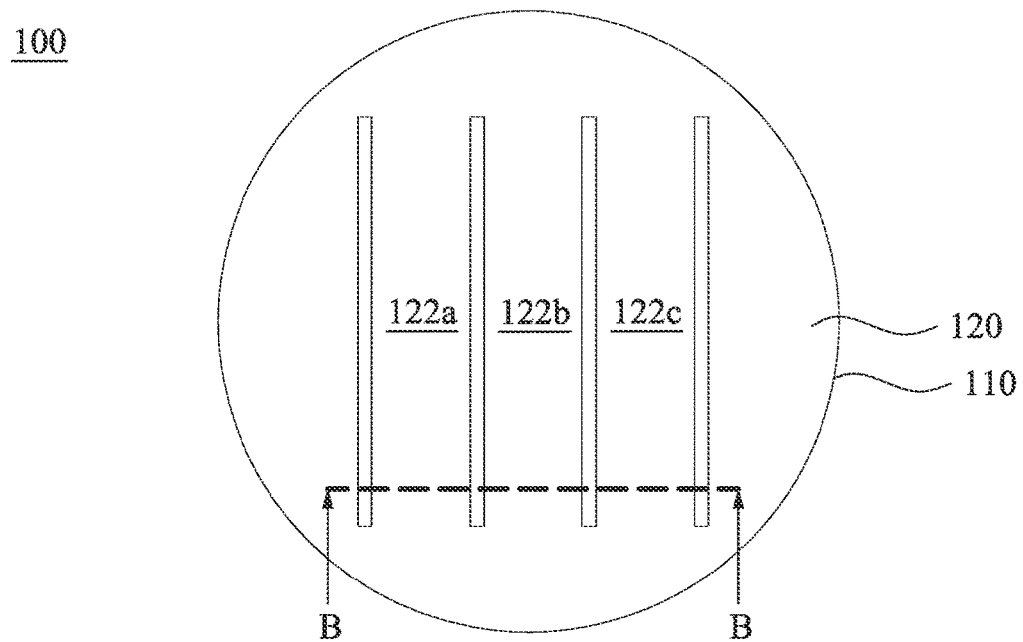
Figure 2B:
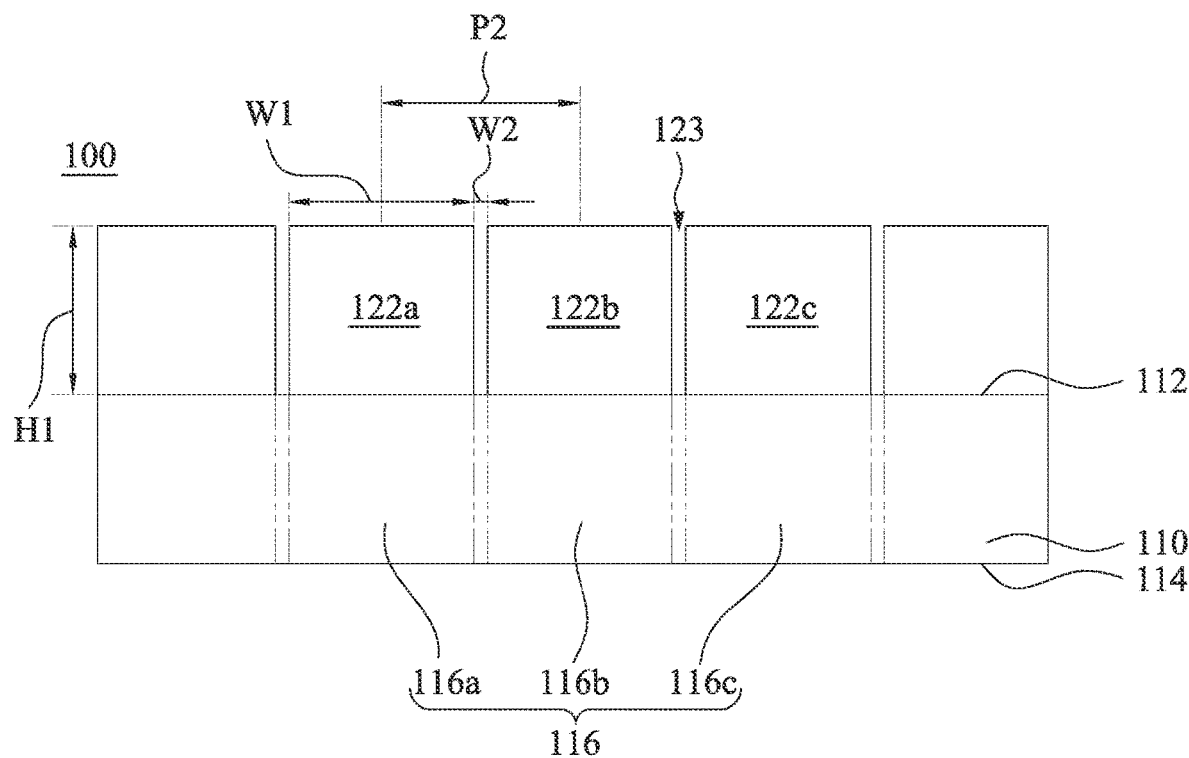

Reference is made to FIGS. 2A and 2B. FIG. 2A illustrates a simplified top view for manufacturing an image sensor device 100 at various stages in accordance with some embodiments, and FIG. 2B is a cross-sectional view taken along line B-B in FIG. 2A. FIGS. 2A and 2B show the first pattern 210 has been transferred to the first photoresist layer 120 to form first photoresist columns 122a-122c on the front side 112 of the device substrate 110 in accordance with some embodiments. It should be understood that three (3) first photoresist columns 122a-122c are shown here for illustration purposes only. The first photoresist layer 120 may include any numbers of first photoresist columns depending on the first pattern 212 for the application. For simplicity, three photoresist columns 122a-122c of the first photoresist layer 120 will be discussed herein.

Photoresist columns 122a-122c define pixel regions for the image sensor device 100. For example, each of the photoresist columns 122a, 122b, and 122c defines a pixel region 116a, 116b, and 116c, respectively, in the device substrate 110. The pixel regions 116a, 116b, and 116c are regions where one or more pixels are to be formed. The pixel regions 116a, 116b, and 116c may be collectively referred to as a pixel array region 116. A logic region (not shown) may be disposed outside the pixel array region 116. The resist pitch P2 of the photoresist columns 122a, 122b, and 122c substantially corresponds to the mask pitch P1 of the first pattern 212. The term "resist pitch" refers to a center-to-center distance between two immediately adjacent photoresist columns. The pixel region pitch of the pixel regions 116a, 116b, and 116c may correspond to the resist pitch P2 of the first photoresist columns 122a, 122b, and 122c. The term "pixel region pitch" described herein refers to a center-to-center distance between two adjacent pixel regions. In cases where the pattern of substantially parallel lines discussed above is used, the pixel region pitch of the pixel regions 116a, 116b, and 116c is greater than 1 micrometer, such as about 1.15 micrometers to about 2 micrometers, for example about 1.2 micrometers to about 1.9 micrometers.

Each of the first photoresist column 122a, 122b, and 122c has a height H1 (i.e., vertical dimension) and a width W1 (i.e., lateral dimension). An aspect ratio of the first photoresist columns 122a, 122b, and 122c may be defined as a ratio of the height H1 to the width W1. For a pixel size on the order of about 1 micrometer, each of the first photoresist columns 122a, 122b, and 122c may have an aspect ratio of about 3:1 to 1:1, for example about 2:1. In some embodiments, the first photoresist columns 122a, 122b, and 122c each has an aspect ratio of about 1:1. The first photoresist columns 122a, 122b, and 122c are separated by a gap or trench 123. The trench 123 has a height, which equals to the height H1 of the first photoresist columns 122a, 122b, and 122c, and a width W2. An aspect ratio of the trench 123 may be defined as a ratio of the height H1 to the width W2. The trench 123 has an aspect ratio of 10:1 or above, such as about 12:1 to about 30:1, for example about 13:1 to about 25:1. Therefore, the aspect ratio of the first photoresist columns 122a, 122b, and 122c is lower than the aspect ratio of the trench 123. In some embodiments, the trench 123 has an aspect ratio of 15:1 to 20:1. In various embodiments, the width W1 of each of the first photoresist columns 122a, 122b, and 122c to the width W2 of the trench 123 may be at a ratio of about 4:1 to about 30:1, such as about 6:1 to about 20:1, for example about 8:1 to about 10:1.

While the trench 123 has an ultrahigh aspect ratio of 10:1 or above, for example 13:1, 15:1 or above, the lower aspect ratio of the first photoresist columns 122a, 122b, and 122c provide sufficient strength to the first photoresist columns 122a, 122b, and 122c to withstand the capillary forces inside the trench 123 without collapsing. Specifically, ultrahigh aspect ratio of the trench 123 and lower aspect ratio of the first photoresist columns 122a, 122b, and 122c result in the increased width W1 of each of the first photoresist columns 122a, 122b, and 122c, which leads to good adhesion of the first photoresist columns 122a, 122b, and 122c to the front side 112 of the device substrate 110. Therefore, the likelihood of the first photoresist columns 122a, 122b, and 122c collapsing is reduced as compared to those high aspect ratio photoresist layers having high aspect ratio of the photoresist columns and trench aspect ratio of 10:1 or greater. As a result, the first photoresist columns 122a, 122b, and 122c can be formed taller and/or closer together (i.e., having a higher aspect ratio trench between the first photoresist columns 122a, 122b, and 122c) without risking collapse of the first photoresist columns 122a, 122b, and 122c. The combination of the lower aspect ratio of the first photoresist columns 122a, 122b, and 122c (such as about 3:1 or lower) and an ultrahigh aspect ratio of the trench (such as 13:1 or greater) are advantageous in performing subsequent fabrication processes such as formation of isolation regions by ion implantation, which will be discussed in greater detail below in FIGS. 3A and 3B.

In some embodiments, the likelihood of collapse of the first photoresist columns 122a, 122b, and 122c can be further decreased by applying a shrinkage material to the exposed surfaces of the first photoresist columns 122a, 122b, and 122c, which will be discussed in more detail in FIGS. 20A and 20B.

Figure 3A:
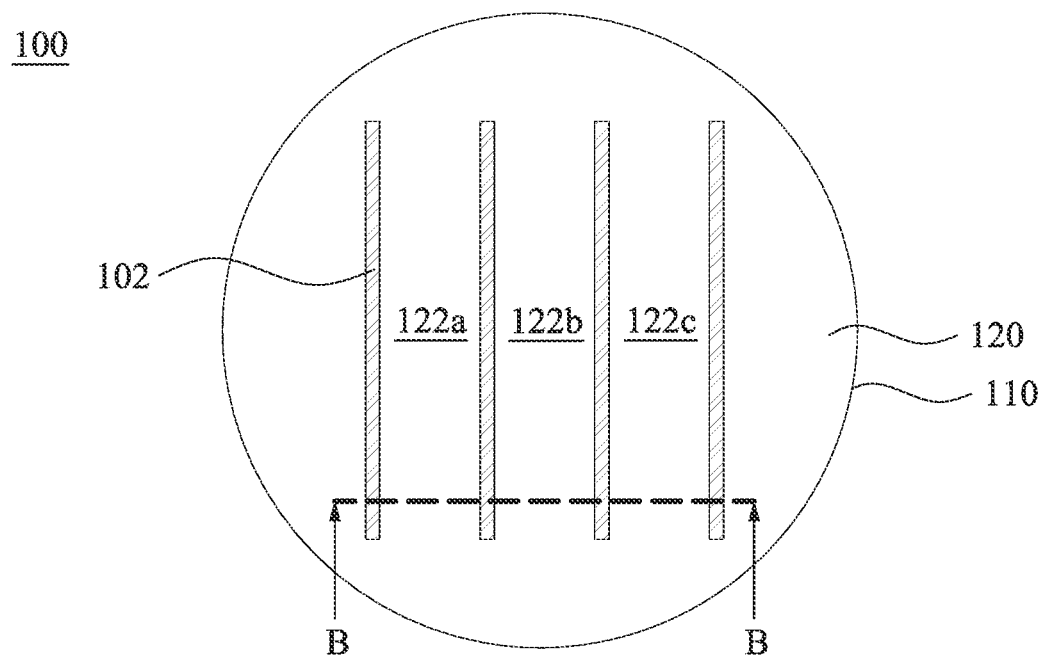
Figure 3B:
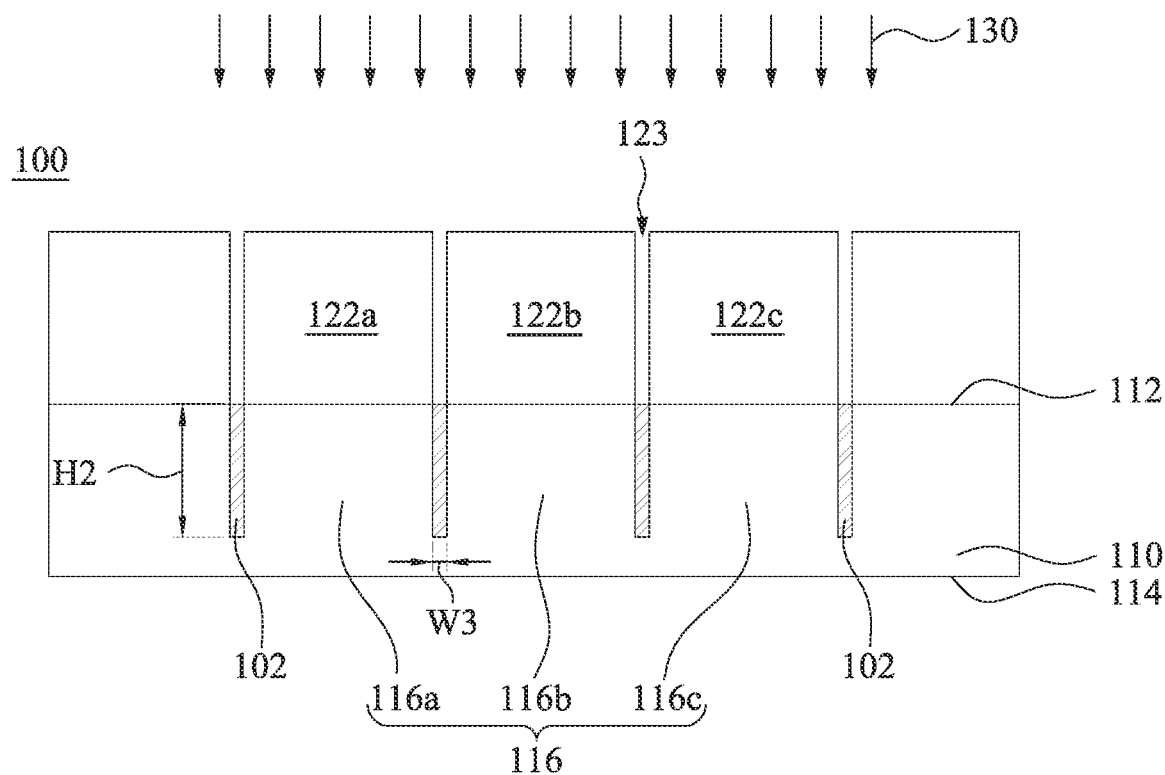

Reference is made to FIGS. 3A and 3B. FIG. 3A illustrates a simplified top view for manufacturing an image sensor device 100 at various stages in accordance with some embodiments, and FIG. 3B is a cross-sectional view taken along line B-B in FIG. 3A. After the first lithography process, the device substrate 110 is subjected to a first ion implantation process 130 to form first isolation regions 102 in the device substrate 110. The first ion implantation process 130 is performed using the first photoresist columns 122a, 122b, and 122c as a mask to implant ions into regions of the device substrate 110 that are not protected by the first photoresist columns 122a, 122b, and 122c. The first isolation regions 102 separate pixel regions 116a, 116b, and 116c from each other. The first isolation regions 102 prevent carriers at a specific pixel region from leakage to adjacent pixel region (also referred to as crosstalk). In some embodiments, the first isolation regions 102 may exceed the depth of each pixel to be formed in the pixel regions 116a, 116b, and 116c. In some embodiments, the first isolation regions 102 may extend from the front side 112 to the back side 114 of the device substrate 110 to provide isolation well between the pixel regions 116a, 116b, and 116c. Since the first photoresist columns 122a, 122b, and 122c are formed with ultrahigh aspect ratio trench between the first photoresist columns 122a, 122b, and 122c, deeper isolation regions can be achieved with limited implant damages to the image sensor device (e.g., isolation regions can be formed with minimum lateral diffusion) even if high implantation energies are used. As a result, the ions can be implanted deeper to provide an effective pixel-to-pixel isolation for the image sensor device 100.

The first isolation regions 102 may be formed of p-type or n-type materials. The first isolation regions 102 may be formed with a material having the same doping polarity as the device substrate 110. In some embodiments, the first isolation regions 102 are p-type regions formed by implanting the device substrate 110 with p-type dopants such as boron, boron fluoride ($BF_2$), diborane ($B_2H_6$), or the like. The doping concentration of the first isolation regions 102 may be in the range of approximately $1\times10^{12}$ ions/cm$^3$ to approximately $1\times10^{20}$ ions/cm$^3$, for example about $1\times10^{18}$ ions/cm$^3$. In some embodiments, the doping concentration of the first isolation regions 102 may be in the range of approximately $5\times10^{11}$ ions/cm$^3$ to approximately $5\times10^{17}$ ions/cm$^3$, for example about $5\times10^{15}$ ions/cm$^3$.

Each first isolation region 102 has a height H2 (vertical dimension) and a width W3 (lateral dimension). An aspect ratio of the first isolation region 102 may be defined as a ratio of the height H2 to the width W3. In some embodiments, the first isolation regions 102 have an aspect ratio of 10:1 or above, for example about 12:1 to about 15:1.

Figure 4A:
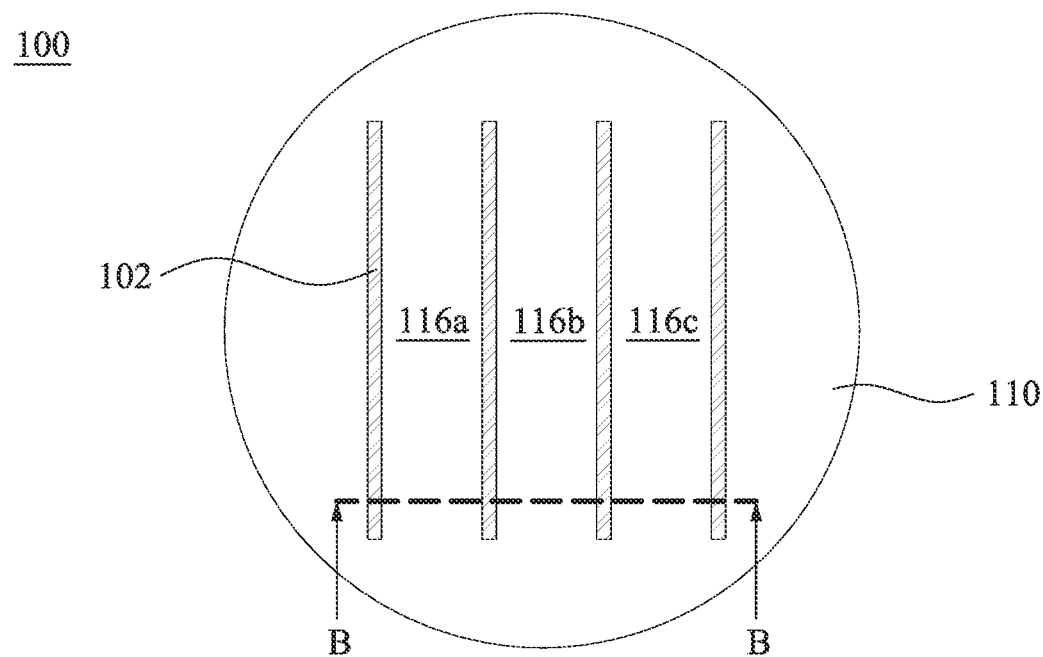
Figure 4B:
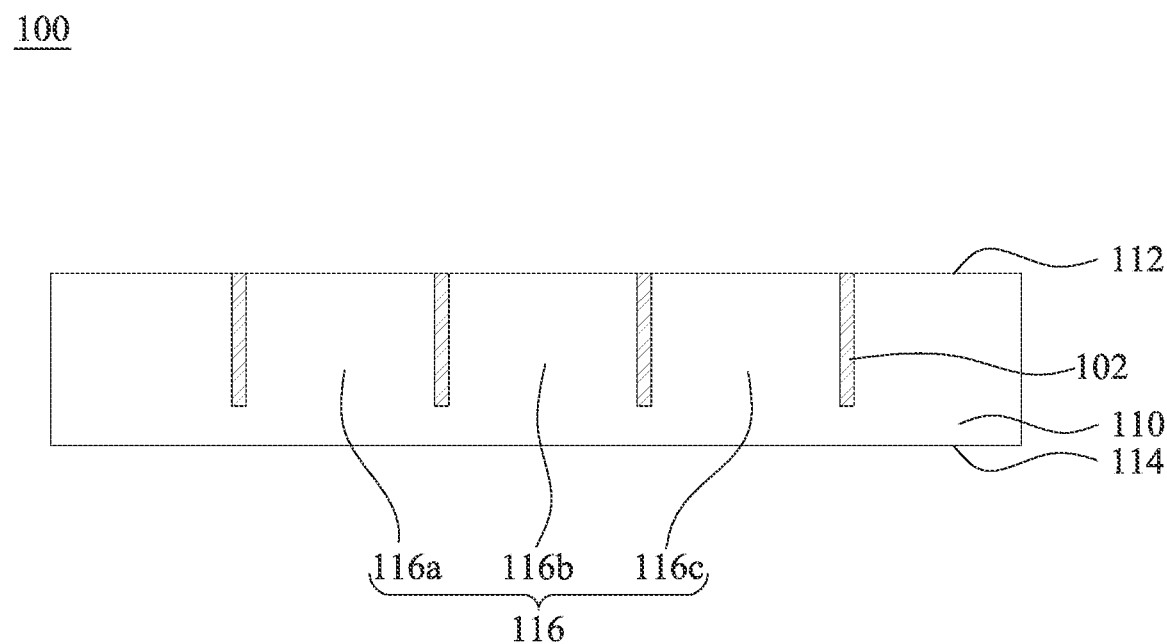

Reference is made to FIGS. 4A and 4B. FIG. 4A illustrates a simplified top view for manufacturing an image sensor device 100 at various stages in accordance with some embodiments, and FIG. 4B is a cross-sectional view taken along line B-B in FIG. 4A. After the first isolation regions 102 have been formed, the first photoresist columns 122a, 122b, and 122c (i.e., the first photoresist layer 120) in FIGS. 3A and 3B are removed, for example, using a photoresist ashing or stripping process.

Figure 5A:
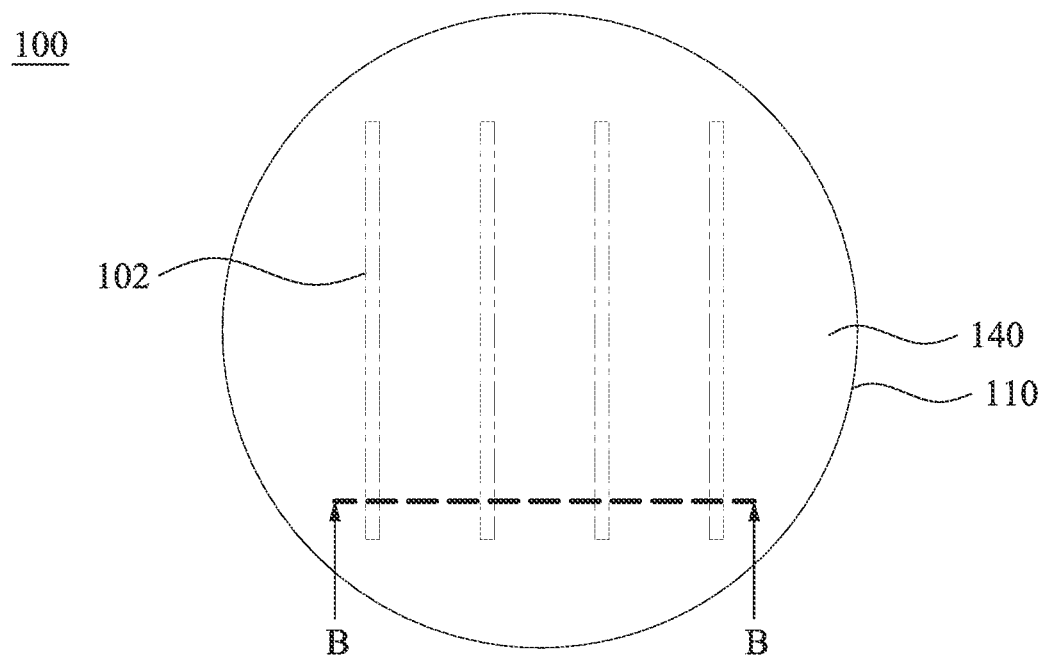
Figure 5B:
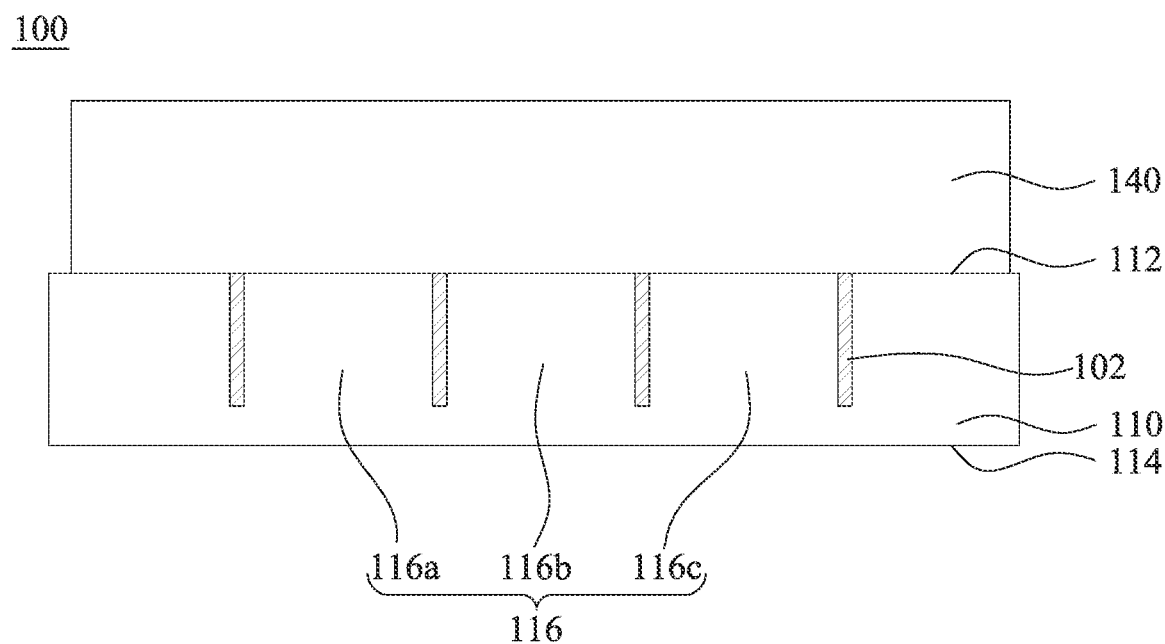

Reference is made to FIGS. 5A and 5B. FIG. 5A illustrates a simplified top view for manufacturing an image sensor device 100 at various stages in accordance with some embodiments, and FIG. 5B is a cross-sectional view taken along line B-B in FIG. 5A. After the first photoresist layer 120 in FIGS. 3A and 3B has been removed, a second photoresist layer 140 is formed over the front side 112 of the device substrate 110. The second photoresist layer 140 may be formed by depositing (e.g., spin-coating) a photoresist film over the front side 112 of the device substrate 110 and thereafter patterning the photoresist film by a second lithography process in the same fashion as discussed above with respect to FIGS. 1C-4B. The second lithography process used to pattern the second photoresist layer 140 is similar to the first lithography process used for the first photoresist layer 120 except that the second lithography process uses a second photomask, which has a pattern that is about half mask pitch offset from the first pattern 212 of the first photomask 210, to pattern the second photoresist layer 140.

Figure 5C:
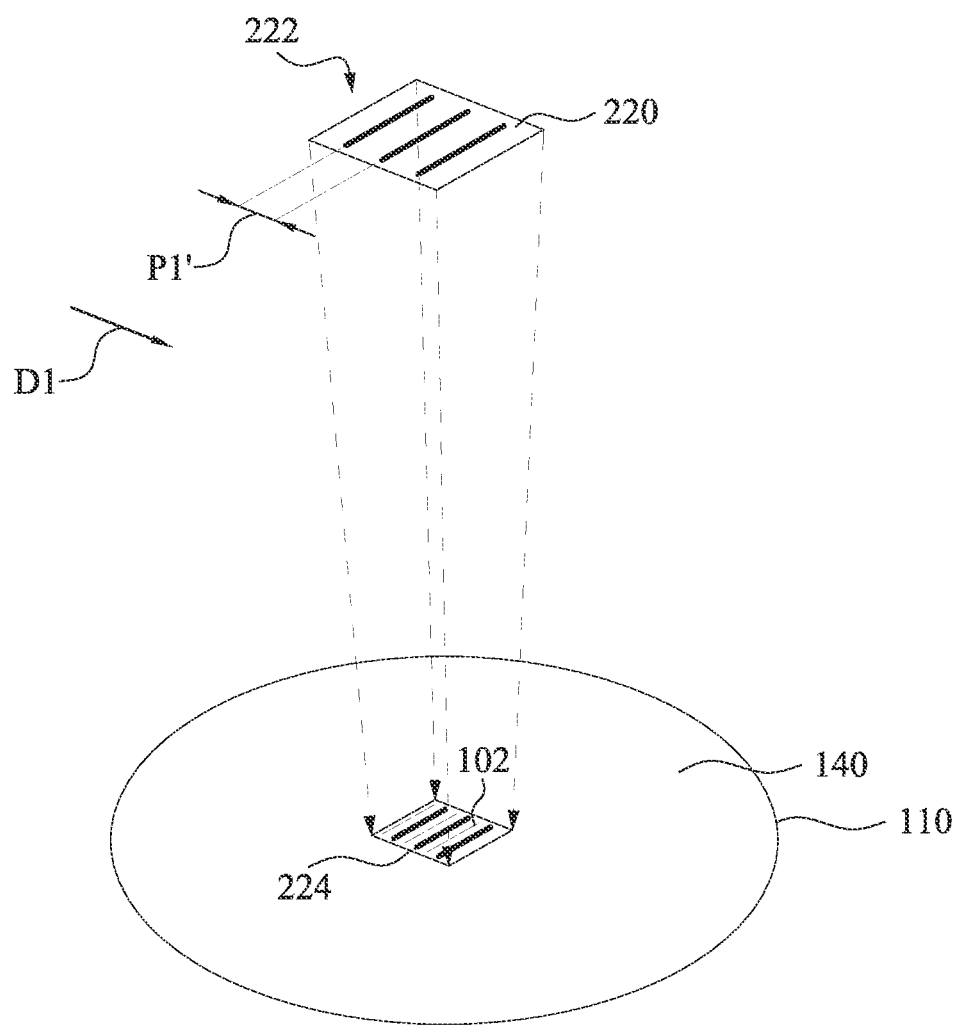

FIG. 5C illustrates a simplified top view of a second photomask 220 having a second pattern 222 in accordance with some embodiments. The second photomask 220 is substantially identical to the first photomask 210 except that the second pattern 222 is laterally shifted (in the first direction D1) by substantially a half mask pitch from the first pattern 212. The first isolation regions 102 are depicted in dashed line for illustration purposes only. Like the first pattern 212 in FIG. 1C, the second pattern 222 may be a pattern of substantially parallel lines having a constant mask pitch P1' greater than about 1 micrometer, such as about 1.15 micrometers to about 3 micrometers, for example about 1.2 micrometers to about 1.9 micrometers. In some embodiments, the pattern of substantially parallel lines has a mask pitch P1' of about 1.8 micrometers. Laterally shift of the second pattern 222 allows pixel regions to be formed in the device substrate 110 in a parallel-lines arrangement. In some embodiments, the mask pitches P1 (see FIG. 1C) and P1' may be substantially the same.

While a laterally shift of the second pattern 222 is discussed, the second pattern 222 may be offset by a half mask pitch from the first pattern 212 in any desired direction such as in a lateral way to double the density of the isolation regions in the device substrate 110, as will be discussed in more detail below. In addition, it is understood that the second pattern 222 is not limited to the pattern of substantially parallel lines as shown. The second pattern 222 may be any other arrangements of patterns and works with the first pattern 212 so that the second photoresist layer 220 is patterned to provide second photoresist columns having a resist pitch greater than 1 micrometer, for example about 1.2 micrometers to about 1.9 micrometers.

During the second lithography process, the mask stage is operable to secure the second photomask 220 and manipulate the photomask in transitional and/or rotational modes. The substrate stage holding the device substrate 110 may also be manipulated in transitional and/or rotational modes.

An alignment device is used to align the photomask and the device substrate 110 so that the radiation beam exposes a field 224 on the device substrate 110. The radiation beam, such as a Krypton Fluoride (KrF) excimer laser with wavelength of 248 nm or an Argon Fluoride (ArF) excimer laser with a wavelength of 193 nm, may scan over the second photomask 220 to expose the field 224 on the device substrate 110. As such, the second pattern 222 is transferred onto the second photoresist layer 140 at the exposure field 224. The lithography apparatus steps the device substrate 110 to a next field (e.g., one scanning field) to expose another field. This step-and-scan process may be performed in the same fashion as the first lithography process until the pixel array region of the device substrate 110 is exposed with the second pattern 222.

While two different photomasks (i.e., first and second photomasks 210 and 220) are used to pattern the first and second photoresist layers 120 and 140, respectively, it is contemplated that the first and second lithography processes may use the same photomask to pattern the first and second photoresist layers 120 and 140 by moving either the mask stage or the substrate stage to achieve the half mask pitch offset movement.

Figure 6A:
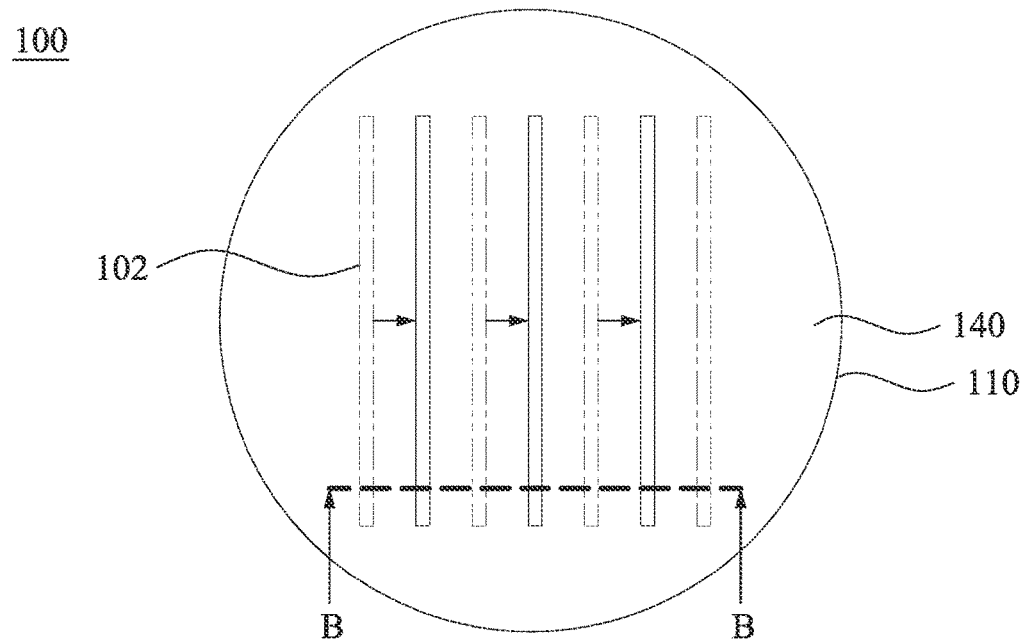
Figure 6B:
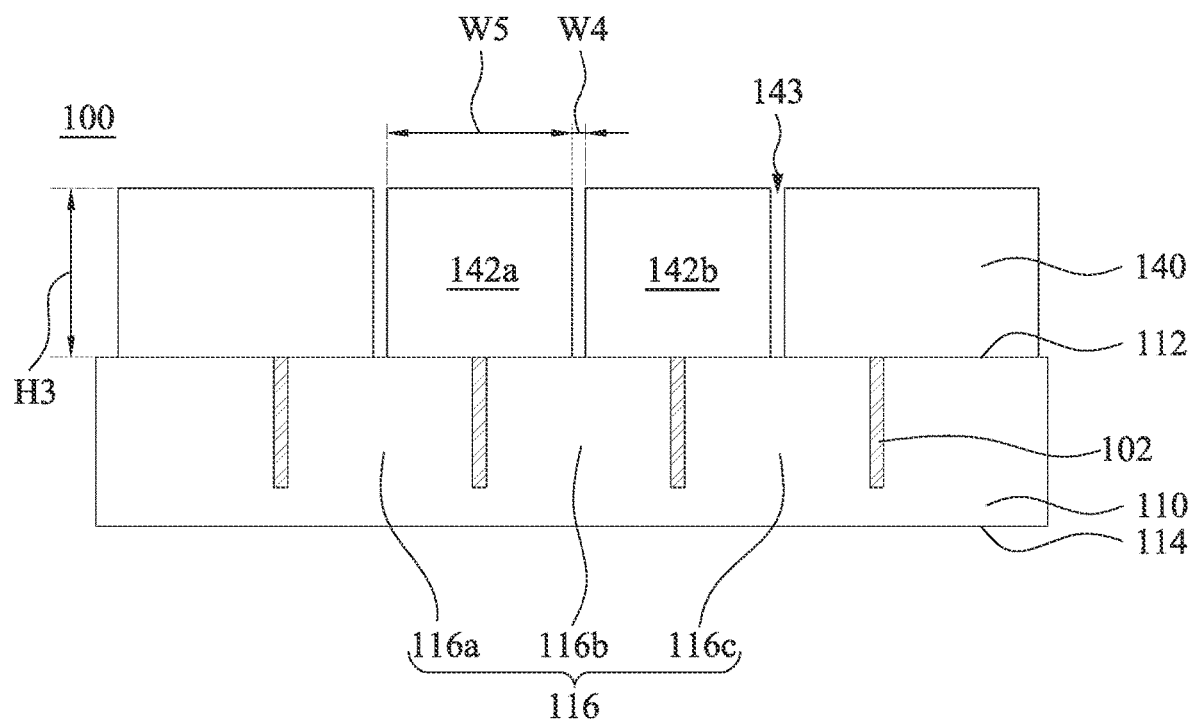

Reference is made to FIGS. 6A and 6B. FIG. 6A illustrates a simplified top view for manufacturing an image sensor device 100 at various stages in accordance with some embodiments, and FIG. 6B is a cross-sectional view taken along line B-B in FIG. 6A. As can be seen, the second pattern 222 has been transferred to the second photoresist layer 140 to form second photoresist columns 142a and 142b on the front side 112 of the device substrate 110. While not shown, it is understood that the patterned photoresist layer 140 has the pattern of substantially parallel lines similar to the arrangement of the first photoresist columns 122a, 122b, and 122c shown in FIGS. 2A and 2B except that the second photoresist columns 142a and 142b are offset laterally by half pitch from the first photoresist columns 122a, 122b, and 122c.

The second photoresist columns 142a and 142b are separated by a trench 143. The trench 143 has a height H3 (vertical dimension), which equals to the height of the second photoresist columns 142a and 142b, and a width W4 (lateral dimension). The trench 143 has substantially the same aspect ratio as that of the trench 123. For example, the trench 143 may have an aspect ratio of 10:1 or above, such as about 12:1 to about 30:1, for example about 13:1 to about 25:1. In some embodiments, the trench 143 has an aspect ratio of 15:1 to 20:1. Similarly, for a pixel size on the order of about 1 micrometer, each of the second photoresist columns 142a and 142b may have an aspect ratio of about 1:1 to about 3:1 or lower, such as about 2:1. In some embodiments, each of the second photoresist columns 142a and 142b has an aspect ratio of about 1:1. Therefore, the aspect ratio of the second photoresist columns 142a and 142b is lower than the aspect ratio of the trench 143. In various embodiments, the width W5 of each of the second photoresist columns 142a and 142b to the width W4 of the trench 143 may be at a ratio of about 4:1 to about 30:1, such as about 6:1 to about 20:1, for example about 8:1 to about 10:1.

Similarly, while the trench 143 has an ultrahigh aspect ratio of 10:1 or above, for example 13:1, 15:1 or above, the second photoresist columns 142a and 142b have sufficient strength to withstand the capillary forces inside the trench 143 without collapsing due to the lower aspect ratio of the second photoresist columns 142a and 142b. Specifically, ultrahigh aspect ratio trench and lower aspect ratio of the second photoresist columns 142a and 142b result in the increased width W5 of each of the second photoresist columns 142a and 142b, which leads to good adhesion of the second photoresist columns 142a and 142b to the front side 112 of the device substrate 110. Therefore, the likelihood of the second photoresist columns 142a and 142b collapsing is reduced as compared to those high aspect ratio photoresist layers having a trench aspect ratio of 10:1 or greater. This means that the second photoresist columns 142a and 142b can be formed taller or closer together (i.e., having a higher aspect ratio trench between the second photoresist columns 142a and 142b) without risking the second photoresist columns 142a and 142b collapse. The combination of the lower aspect ratio of the second photoresist columns 142a and 142b (such as about 3:1 or lower) and an ultrahigh aspect ratio trench (such as 13:1 or greater) are advantageous in performing subsequent fabrication processes such as formation of second isolation regions by ion implantation.

In some embodiments, the likelihood of the second photoresist columns 142a and 142b collapsing can be further decreased by applying a shrinkage material to the exposed surfaces of the second photoresist columns 142a and 142b, which will be discussed in more detail in FIGS. 20A and 20B.

Figure 7A:
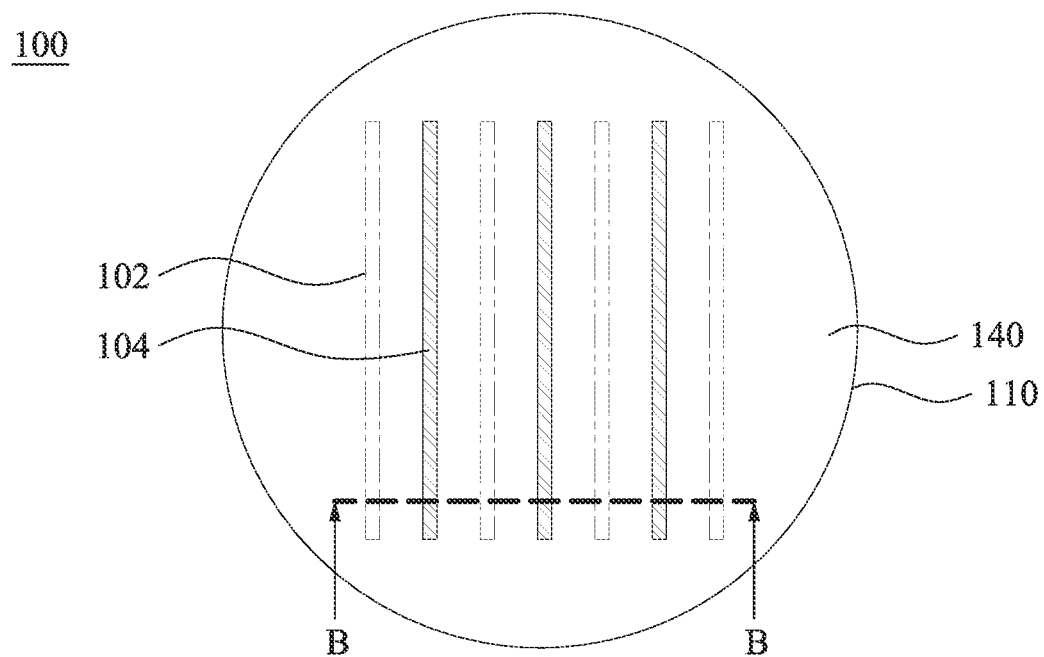
Figure 7B:
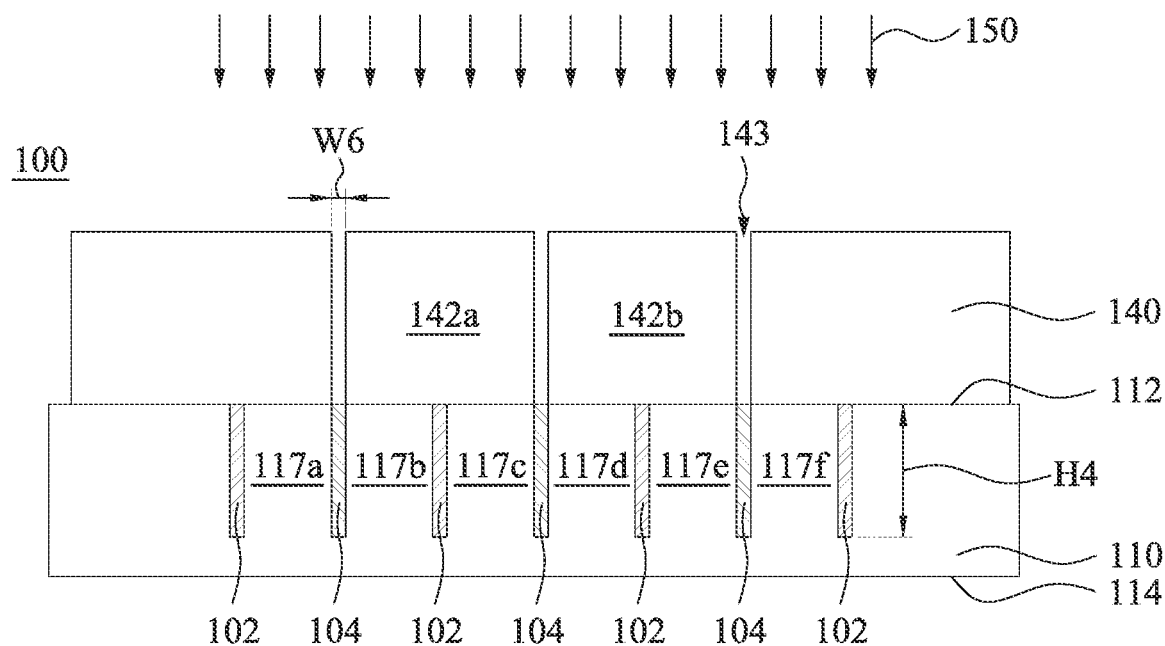

Reference is made to FIGS. 7A and 7B. FIG. 7A illustrates a simplified top view for manufacturing an image sensor device 100 at various stages in accordance with some embodiments, and FIG. 7B is a cross-sectional view taken along line B-B in FIG. 7A. After the second lithography process, the device substrate 110 is subjected to a second ion implantation process 150 to form second isolation regions 104 in the device substrate 110. The second ion implantation process 150 is performed using the second photoresist columns 142a and 142b as a mask to implant ions into regions of the device substrate 110 that are not protected by the second photoresist columns 142a and 142b. Since the second photoresist columns 142a and 142b are offset by half pitch from the first photoresist columns 122a, 122b, and 122c, the resulting second isolation regions 104 will divide each of the pixel regions 116a, 116b, and 116c in half and separate the divided pixel regions from each other. The second isolation regions 104 prevent carriers at a specific pixel region from leakage to adjacent pixel region. The second isolation regions 104 may exceed the depth of each pixel to be formed in the divided pixel regions. In some embodiments, the second isolation regions 104 may extend from the front side 112 to the back side 114 of the device substrate 110 to provide isolation well between the divided pixel regions. Since the second photoresist columns 142a and 142b are formed with ultrahigh aspect ratio trench between the second photoresist columns 142a and 142b, deeper isolation regions can be achieved with limited implant damages to the image sensor device (e.g., isolation regions can be formed with minimum lateral diffusion) even if high implantation energies are used. As a result, the ions can be implanted deeper to provide an effective pixel-to-pixel isolation for the image sensor device 100.

Each second isolation region 104 has a height H4 (vertical dimension) and a width W6 (lateral dimension). An aspect ratio of the second isolation region 104 may be defined as a ratio of the height H4 to the width W6. In some embodiments, the second isolation regions 104 have an aspect ratio of 10:1 or above, for example about 12:1 to about 15:1. Since the first and second isolation regions 102 and 104 are formed separately, the height H4 of the second isolation regions 104 may be different from the height H2 of the first isolation regions 102 (see FIG. 3B). Alternatively, the height H4 of the second isolation regions 104 may be substantially the same as the height H2 of the first isolation regions 102.

Similar to the first isolation regions 102, the second isolation regions 104 may be formed of p-type or n-type materials and contain the same doping polarity as the device substrate 110 and/or the first isolation regions 102. For example, the second isolation regions 104 may be p-type regions formed by implanting the device substrate 110 with p-type dopants such as boron, boron fluoride ($BF_2$), diborane ($B_2H_6$), or the like. The doping concentration of the second isolation regions 104 may be of approximately $1\times10^{12}$ ions/$cm^3$ and up to approximately $5\times10^{17}$ ions/$cm^3$, like the first isolation regions 102. Each second isolation region 104 may have an aspect ratio of 10:1 or above, for example about 12:1 to about 15:1.

In cases where the second pattern 222 in FIG. 5C uses a pattern of substantially parallel lines having a mask pitch of about 1.8 micrometers, the second lithography process and the second ion implantation process 150 will form second isolation regions 104 and the first isolation regions 102 at a constant pitch P2' of about 0.9 micrometers, which is at sub-micrometer levels. By performing two lithography processes (i.e., two mask patterning process), the density of the pixel regions (such as pixel regions 117a-117f shown in FIGS. 7A and 7B) can be increased by more than double. Particularly, the lithography processes are performed using photoresist columns with ultrahigh aspect ratio trench (e.g., greater than 13:1) without the risk of photoresist pattern collapsing.

Figure 8A:
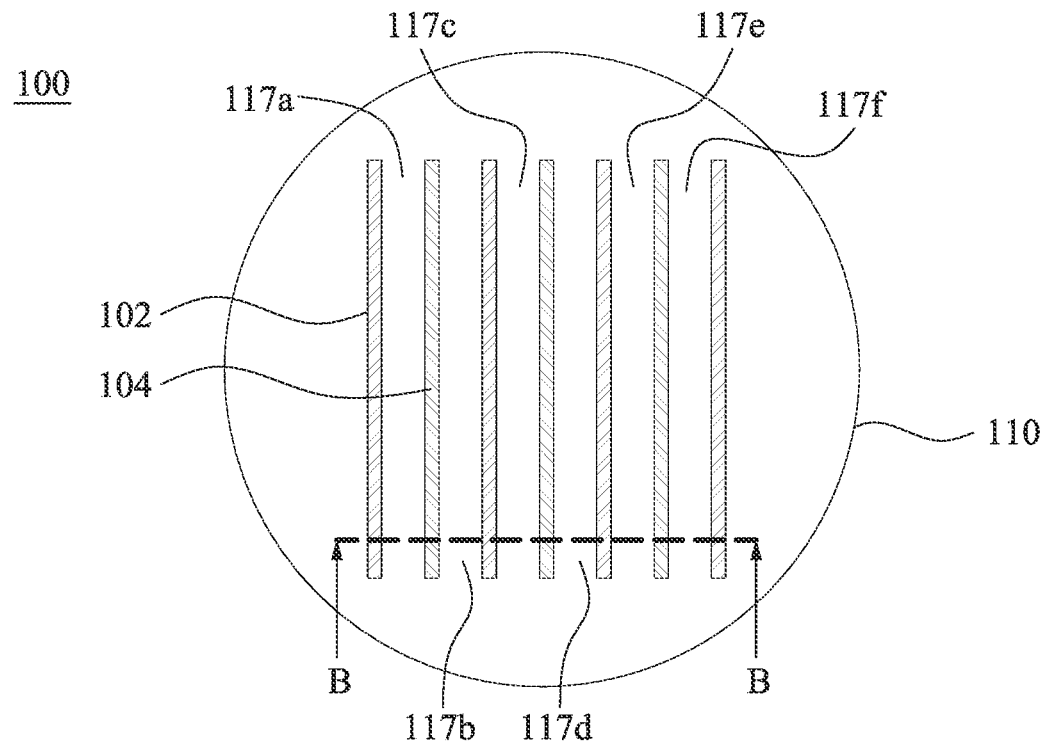
Figure 8B:
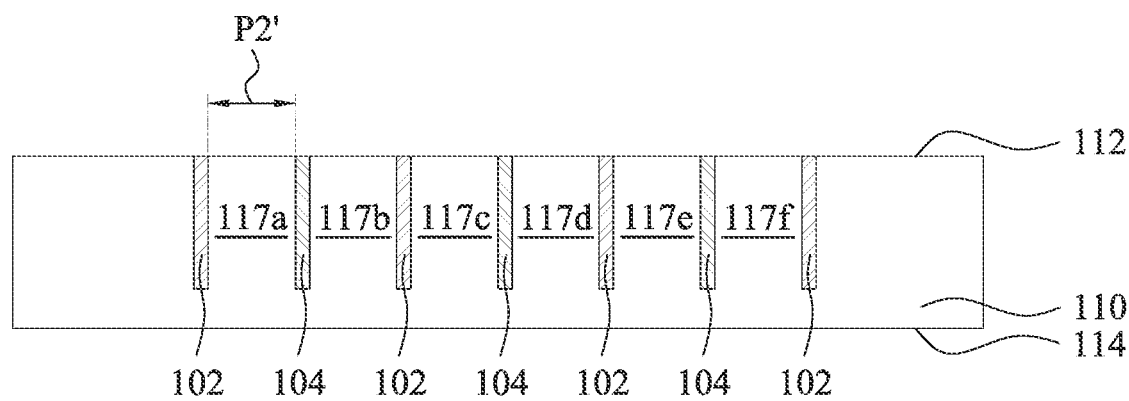

Reference is made to FIGS. 8A and 8B. FIG. 8A illustrates a simplified top view for manufacturing an image sensor device 100 at various stages in accordance with some embodiments, and FIG. 8B is a cross-sectional view taken along line B-B in FIG. 8A. After the second isolation regions 104 have been formed, the second photoresist columns 142a, 142b are removed, for example, using a photoresist ashing or stripping process. It is contemplated that the processes described above can be repeated to obtain high density of isolation regions at sub-micrometer pitch or even below.

Figure 9A:
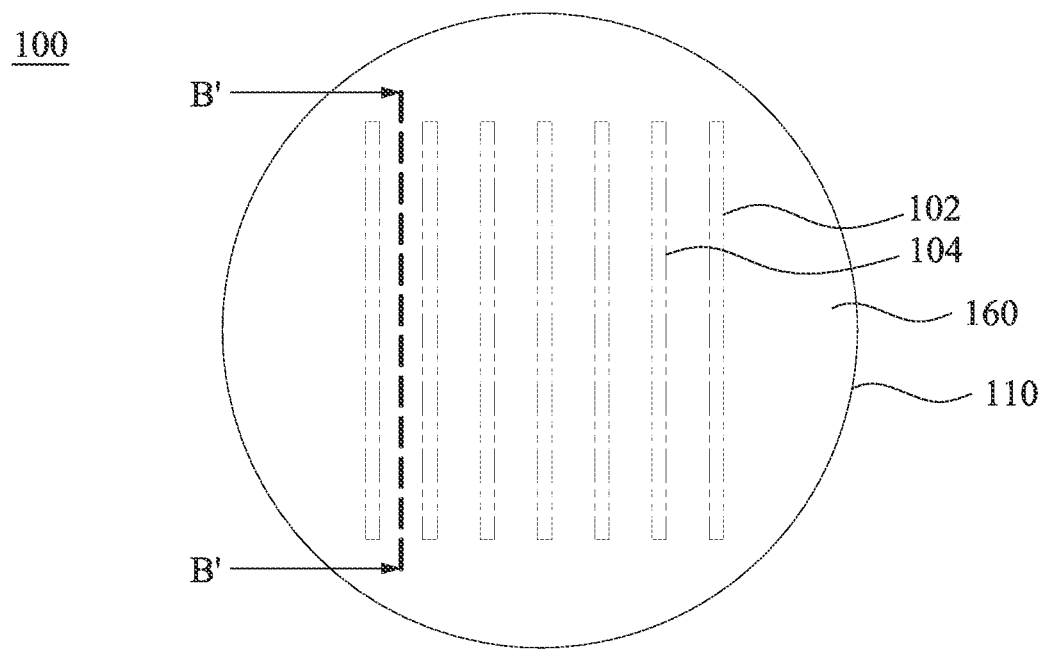
Figure 9B:
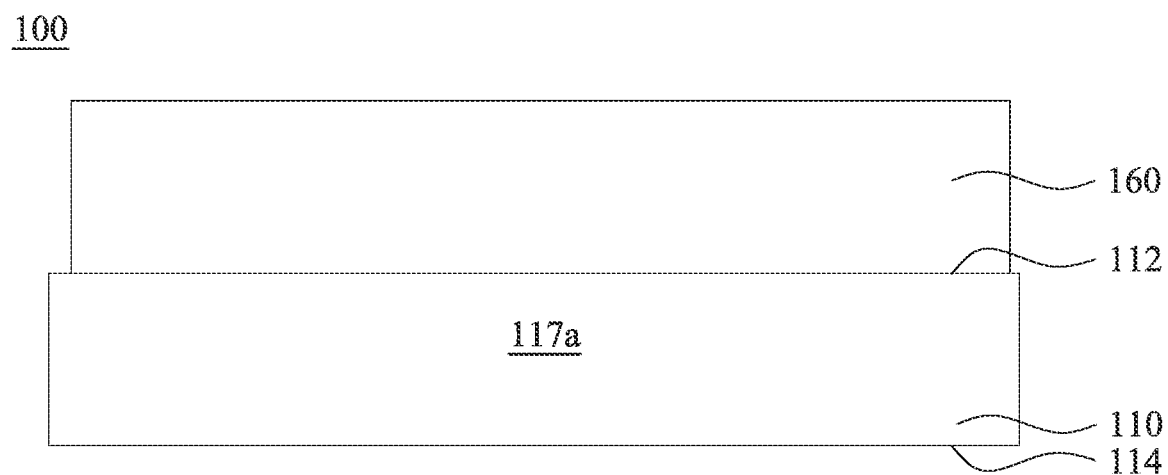

Reference is made to FIGS. 9A and 9B. FIG. 9A illustrates a simplified top view for manufacturing an image sensor device 100 at various stages in accordance with some embodiments, and FIG. 9B is a cross-sectional view taken along line B'-B' in FIG. 9A. After the second photoresist layer 140 in FIGS. 7A and 7B has been removed, a third photoresist layer 160 is formed over the front side 112 of the device substrate 110. The third photoresist layer 160 may be formed by depositing (e.g., spin-coating) a photoresist film over the front side 112 of the device substrate 110 and thereafter patterning the photoresist film by a third lithography process in the same fashion as discussed above with respect to FIGS. 1C-4B. The third lithography process used to pattern the third photoresist layer 160 is similar to the first lithography process used for the first photoresist layer 120 except that the third lithography process uses a third photomask, which has a pattern that is substantially perpendicular to the first pattern 212 of the first photomask 210, to pattern the third photoresist layer 160.

Figure 9C:
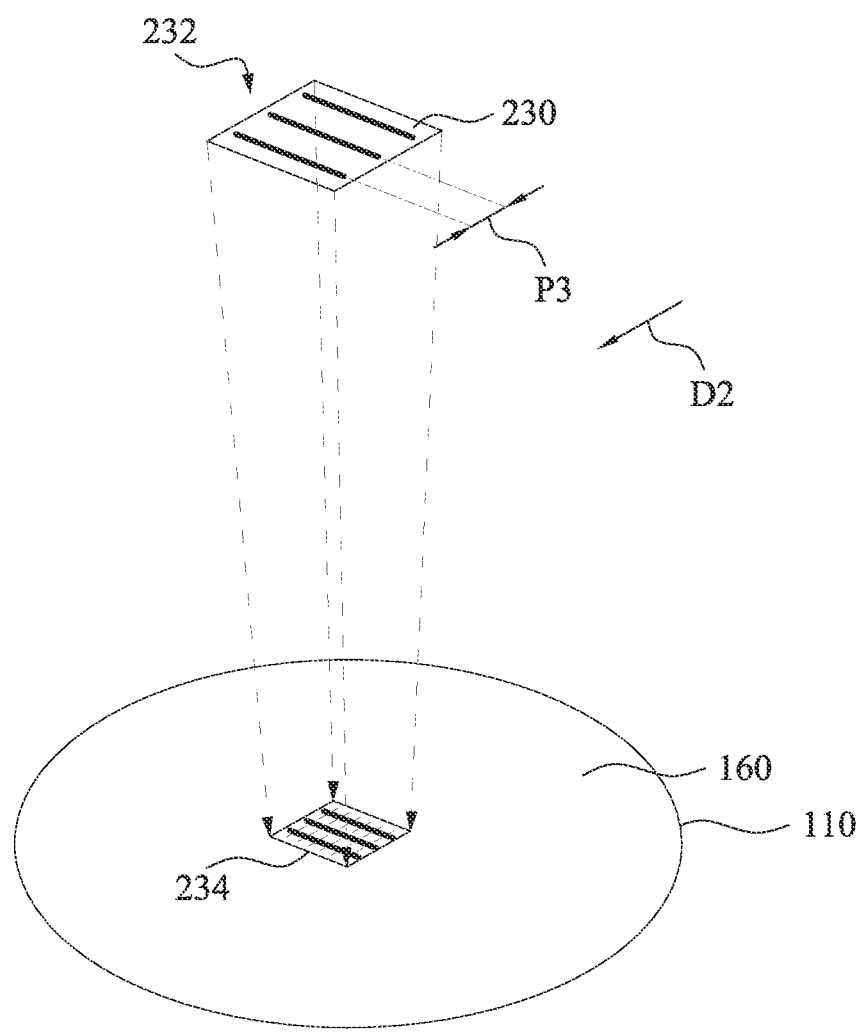

FIG. 9C illustrates a simplified top view of a third photomask 230 having a third pattern 232 in accordance with some embodiments. The third photomask 230 is substantially identical to the first photomask 210 except that the third pattern 232 is substantially perpendicular to the first pattern 212 (i.e., rotated from the first pattern 212 by about 90 degrees). The first and second isolation regions are depicted in dashed line for illustration purposes only. Like the first pattern 212 in FIG. 1C, the third pattern 232 may be a pattern of substantially parallel lines arranged in a second direction D2 and having a constant mask pitch P3 greater than about 1 micrometer, such as about 1.15 micrometers to about 3 micrometers, for example about 1.2 micrometers to about 1.9 micrometers. In some embodiments, the pattern of substantially parallel lines has a mask pitch P3 of about 1.8 micrometers. The third pattern 232 allows pixel regions to be formed in the device substrate 110 in a parallel-lines arrangement. In some embodiments, the mask pitches P1 (see FIG. 1C) and P3 may be substantially the same or different. It is understood that the mask pitch P3 of the third pattern 232 may vary depending on the critical dimension (CD) of the pattern(s) to be formed in the third photoresist layer 160. The radiation beam may scan over the third photomask 230. The features of the third pattern 232 allow the radiation beam to pass through and expose a field 234 on the device substrate 110. The field 234 may define at least one edge of a die (or chip).

Figure 10A:
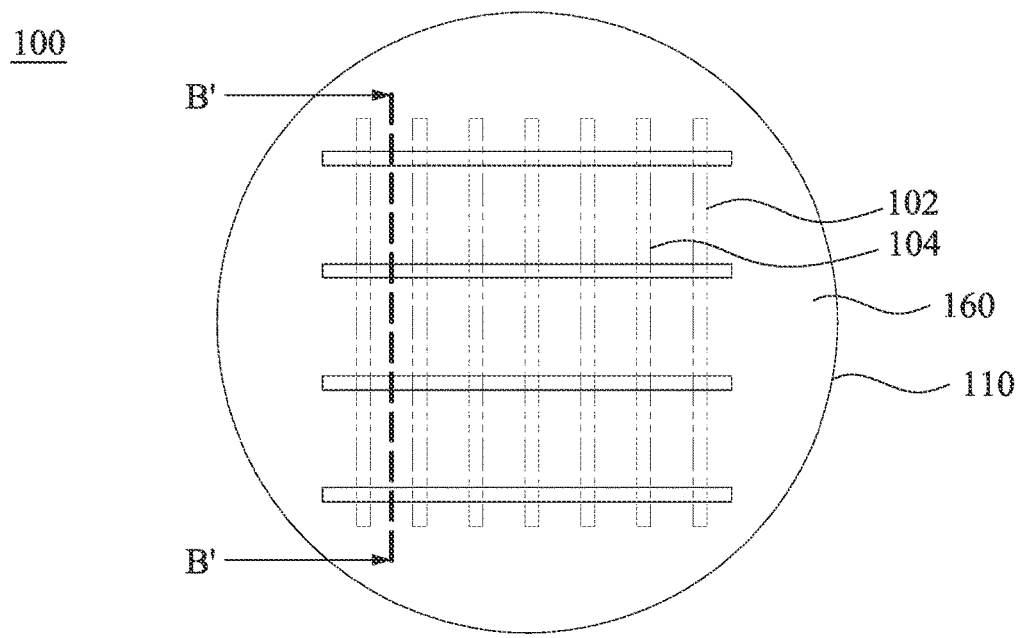
Figure 10B:
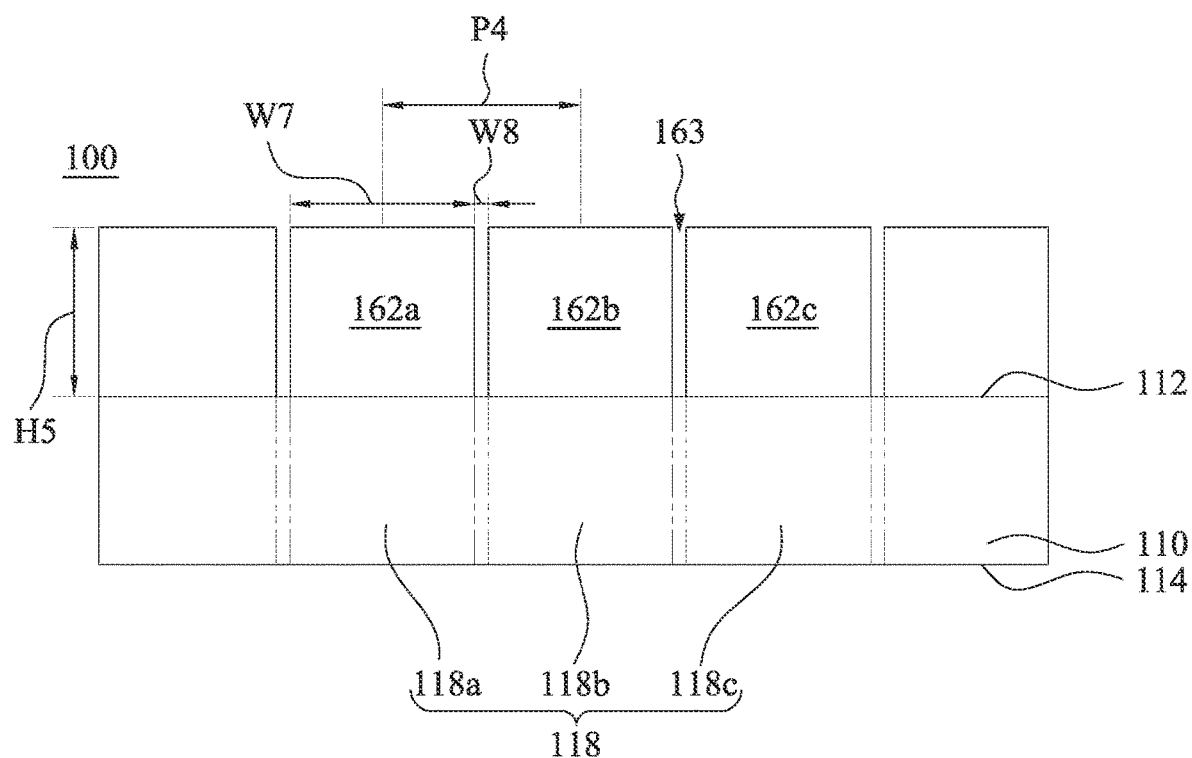

Reference is made to FIGS. 10A and 10B. FIG. 10A illustrates a simplified top view for manufacturing an image sensor device 100 at various stages in accordance with some embodiments, and FIG. 10B is a cross-sectional view taken along line B'-B' in FIG. 10A. FIGS. 10A and 10B show the third pattern 230 has been transferred to the third photoresist layer 160 to form third photoresist columns 162a-162c on the front side 112 of the device substrate 110 in accordance with some embodiments. It should be understood that three (3) third photoresist columns 162a-162c are shown here for illustration purposes only. The third photoresist layer 160 may include any numbers of third photoresist columns depending on the third pattern 232 for the application. For simplicity, three photoresist columns 162a-162c of the third photoresist layer 160 will be discussed herein.

Photoresist columns 162a-162c define pixel regions for the image sensor device 100. For example, each of the photoresist columns 162a, 162b, and 162c defines a pixel region 118a, 118b, and 118c, respectively, in the device substrate 110. The pixel regions 118a, 118b, and 118c are regions where one or more pixels are to be formed. The pixel regions 118a, 118b, and 118c may be collectively referred to as a pixel array region 118 (or the pixel array region 116 in FIG. 2B). The resist pitch P4 of the photoresist columns 162a, 162b, and 162c substantially corresponds to the mask pitch P3 of the third pattern 232. The term "resist pitch" refers to a center-to-center distance between two immediately adjacent photoresist columns. The pixel region pitch of the pixel regions 118a, 118b, and 118c may correspond to the resist pitch P4 of the third photoresist columns 162a, 162b, and 162c. The term "pixel region pitch" described herein refers to a center-to-center distance between two adjacent pixel regions. In cases where the pattern of substantially parallel lines discussed above is used, the pixel region pitch of the pixel regions 118a, 118b, and 118c is greater than 1 micrometer, such as about 1.15 micrometers to about 2 micrometers, for example about 1.2 micrometers to about 1.9 micrometers.

Each of the third photoresist column 162a, 162b, and 162c has a height H5 (i.e., vertical dimension) and a width W7 (i.e., lateral dimension). An aspect ratio of the third photoresist columns 162a, 162b, and 162c may be defined as a ratio of the height H5 to the width W7. For a pixel size on the order of about 1 micrometer, each of the third photoresist columns 162a, 162b, and 162c may have an aspect ratio of about 3:1 to 1:1, for example about 2:1. In some embodiments, the third photoresist columns 162a, 162b, and 162c each has an aspect ratio of about 1:1. The third photoresist columns 162a, 162b, and 162c are separated by a gap or trench 163. The trench 163 has a height, which equals to the height H5 of the third photoresist columns 162a, 162b, and 162c, and a width W8. An aspect ratio of the trench 163 may be defined as a ratio of the height H5 to the width W8. The trench 163 has an aspect ratio of 10:1 or above, such as about 12:1 to about 30:1, for example about 13:1 to about 25:1. Therefore, the aspect ratio of the third photoresist columns 162a, 162b, and 162c is lower than the aspect ratio of the trench 163. In some embodiments, the trench 163 has an aspect ratio of 15:1 to 20:1. In various embodiments, the width W7 of each of the third photoresist columns 162a, 162b, and 162c to the width W8 of the trench 163 may be at a ratio of about 4:1 to about 30:1, such as about 6:1 to about 20:1, for example about 8:1 to about 10:1.

While the trench 163 has an ultrahigh aspect ratio of 10:1 or above, for example 13:1, 15:1 or above, the lower aspect ratio of the third photoresist columns 162a, 162b, and 162c provide sufficient strength to the third photoresist columns 162a, 162b, and 162c to withstand the capillary forces inside the trench 163 without collapsing. Therefore, the likelihood of the third photoresist columns 162a, 162b, and 162c collapsing is reduced as compared to those high aspect ratio photoresist layers having high aspect ratio photoresist columns and trench aspect ratio of 10:1 or greater. As a result, the third photoresist columns 162a, 162b, and 162c can be formed taller and/or closer together (i.e., having a higher aspect ratio trench between the third photoresist columns 162a, 162b, and 162c) without risking collapse of the third photoresist columns 162a, 162b, and 162c.

In some embodiments, the likelihood of collapse of the third photoresist columns 162a, 162b, and 162c can be further decreased by applying a shrinkage material to the exposed surfaces of the third photoresist columns 162a, 162b, and 162c, which will be discussed in more detail in FIGS. 20A and 20B.

Figure 11A:
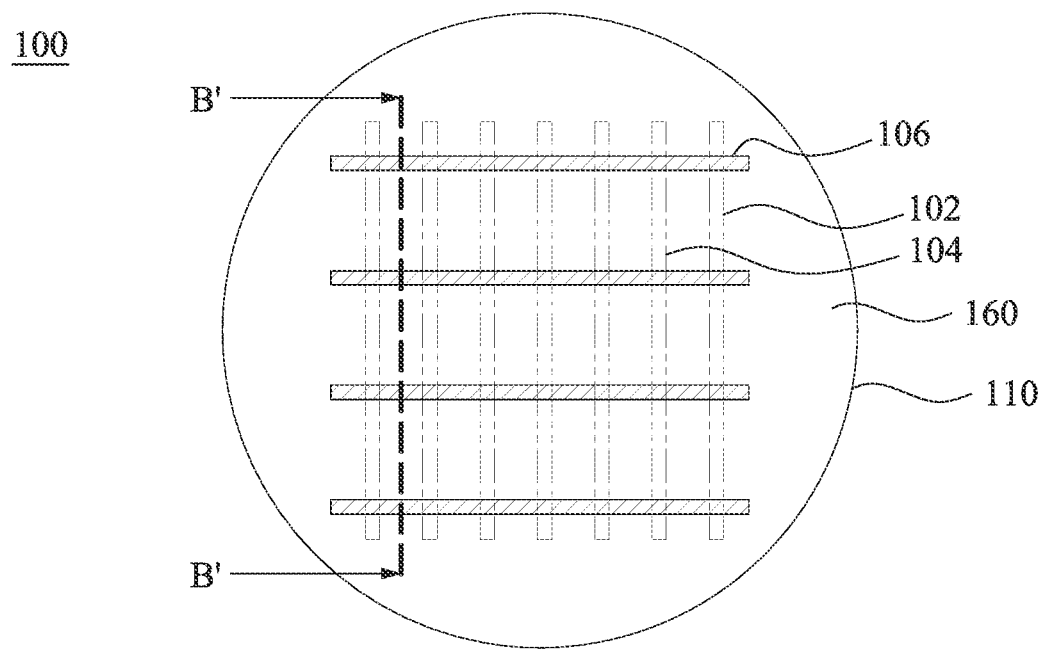
Figure 11B:
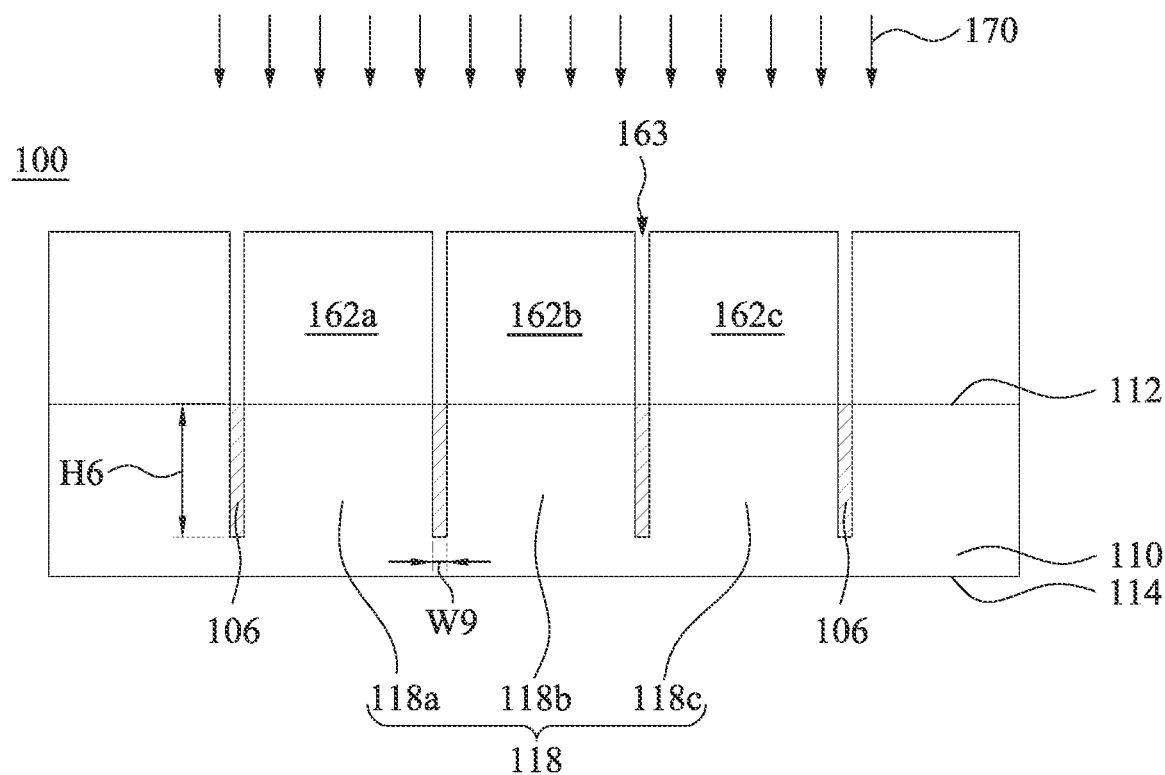

Reference is made to FIGS. 11A and 11B. FIG. 11A illustrates a simplified top view for manufacturing an image sensor device 100 at various stages in accordance with some embodiments, and FIG. 11B is a cross-sectional view taken along line B'-B' in FIG. 11A. After the third lithography process, the device substrate 110 is subjected to a third ion implantation process 170 to form third isolation regions 106 in the device substrate 110. The third ion implantation process 170 is performed using the third photoresist columns 162a, 162b, and 162c as a mask to implant ions into regions of the device substrate 110 that are not protected by the third photoresist columns 162a, 162b, and 162c. The third isolation regions 106 separate pixel regions 118a, 118b, and 118c from each other. The third isolation regions 106 prevent carriers at a specific pixel region from leakage to adjacent pixel region (also referred to as crosstalk). In some embodiments, the third isolation regions 106 may exceed the depth of each pixel to be formed in the pixel regions 118a, 118b, and 118c. In some embodiments, the third isolation regions 106 may extend from the front side 112 to the back side 114 of the device substrate 110 to provide isolation well between the pixel regions 118a, 118b, and 118c. Since the third photoresist columns 162a, 162b, and 162c are formed with ultrahigh aspect ratio trench between the third photoresist columns 162a, 162b, and 162c, deeper isolation regions can be achieved with limited implant damages to the image sensor device (e.g., isolation regions can be formed with minimum lateral diffusion) even if high implantation energies are used. As a result, the ions can be implanted deeper to provide an effective pixel-to-pixel isolation for the image sensor device 100.

The third isolation regions 106 may be formed of p-type or n-type materials. The third isolation regions 106 may be formed with a material having the same doping polarity as the device substrate 110 and/or the first and second isolation regions 102 and 104. In some embodiments, the third isolation regions 106 are p-type regions formed by implanting the device substrate 110 with p-type dopants such as boron, boron fluoride ($BF_2$), diborane ($B_2H_6$), or the like. The doping concentration of the third isolation regions 106 may be in the range of approximately $1 \times 10^{12}$ ions/cm³ to approximately $1 \times 10^{20}$ ions/cm³, for example about $1 \times 10^{18}$ ions/cm³. In some embodiments, the doping concentration of the third isolation regions 106 may be in the range of approximately $5 \times 10^{11}$ ions/cm³ to approximately $5 \times 10^{17}$ ions/cm³, for example about $5 \times 10^{15}$ ions/cm³. Further, the third isolation regions 106 cross over the first and second isolation regions 102 and 104, and the crossing portions thereof has a doping concentrations greater than the doping concentrations of the first, second, and/or third isolation regions 102, 104, and/or 106. For example, the crossing portion has a doping concentration substantially double the doping concentration of individually first, second, and third isolation regions 102, 104, and 106.

Each third isolation region 106 has a height H6 (vertical dimension) and a width W9 (lateral dimension). An aspect ratio of the third isolation region 106 may be defined as a ratio of the height H6 to the width W9. In some embodiments, the third isolation regions 106 have an aspect ratio of 10:1 or above, for example about 12:1 to about 15:1. In some embodiments, the height H6 may be different or substantially the same as the height H2 of the first isolation regions 102 (see FIG. 3B) and/or the height H4 of the second isolation regions 104 (see FIG. 7B). Alternatively, the height H6 of the third isolation regions 106 may be substantially the same as the height H2 of the first isolation regions 102 and/or the height H4 of the second isolation regions 104.

Figure 12A:
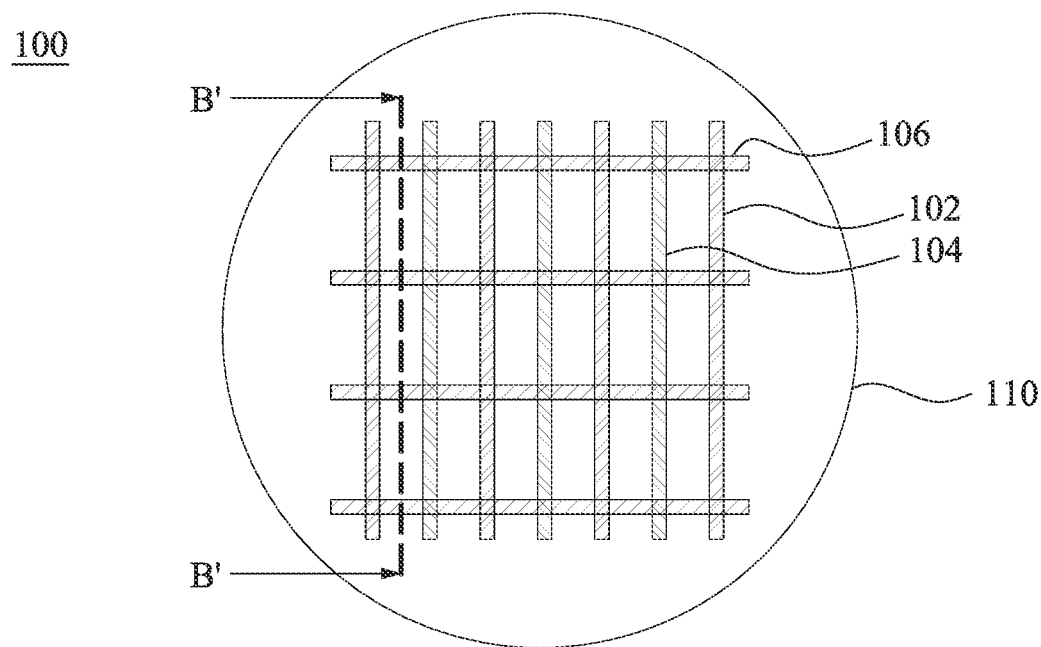
Figure 12B:
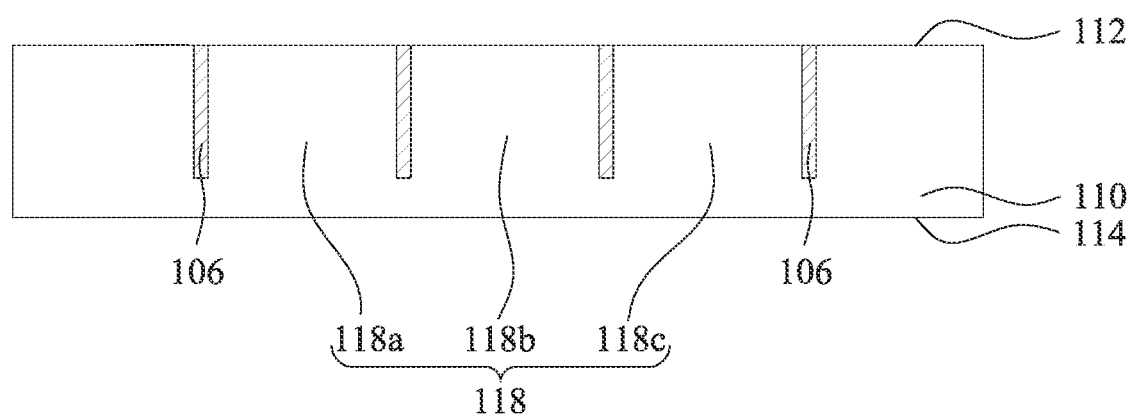

Reference is made to FIGS. 12A and 12B. FIG. 12A illustrates a simplified top view for manufacturing an image sensor device 100 at various stages in accordance with some embodiments, and FIG. 12B is a cross-sectional view taken along line B'-B' in FIG. 12A. After the third isolation regions 106 have been formed, the third photoresist columns 162a, 162b, and 162c (i.e., the third photoresist layer 160) in FIGS. 11A and 11B are removed, for example, using a photoresist ashing or stripping process.

Figure 13A:
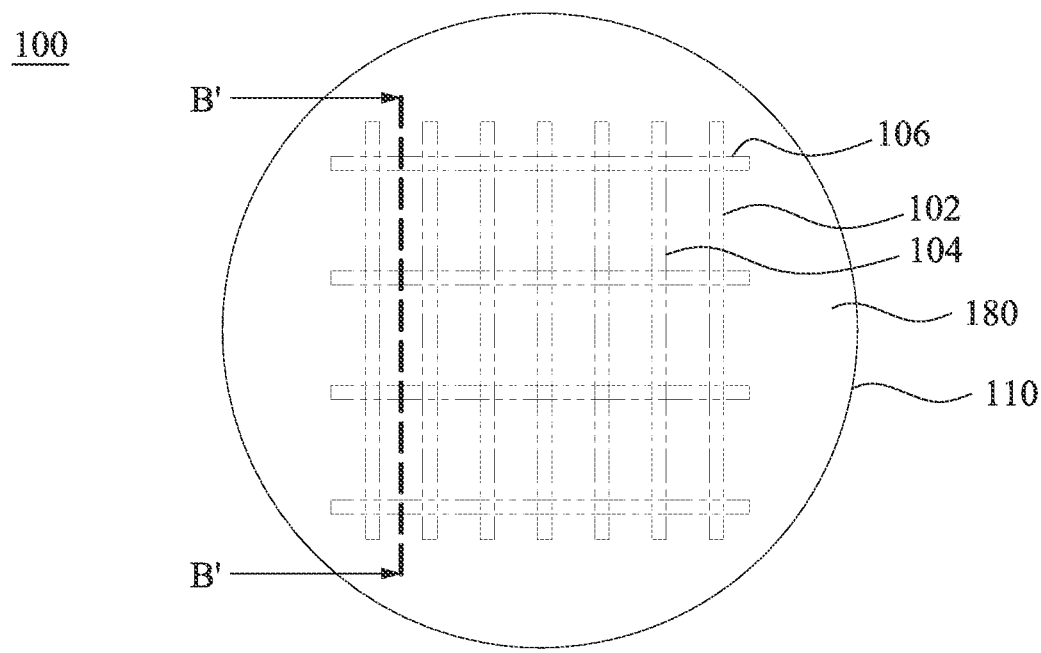
Figure 13B:
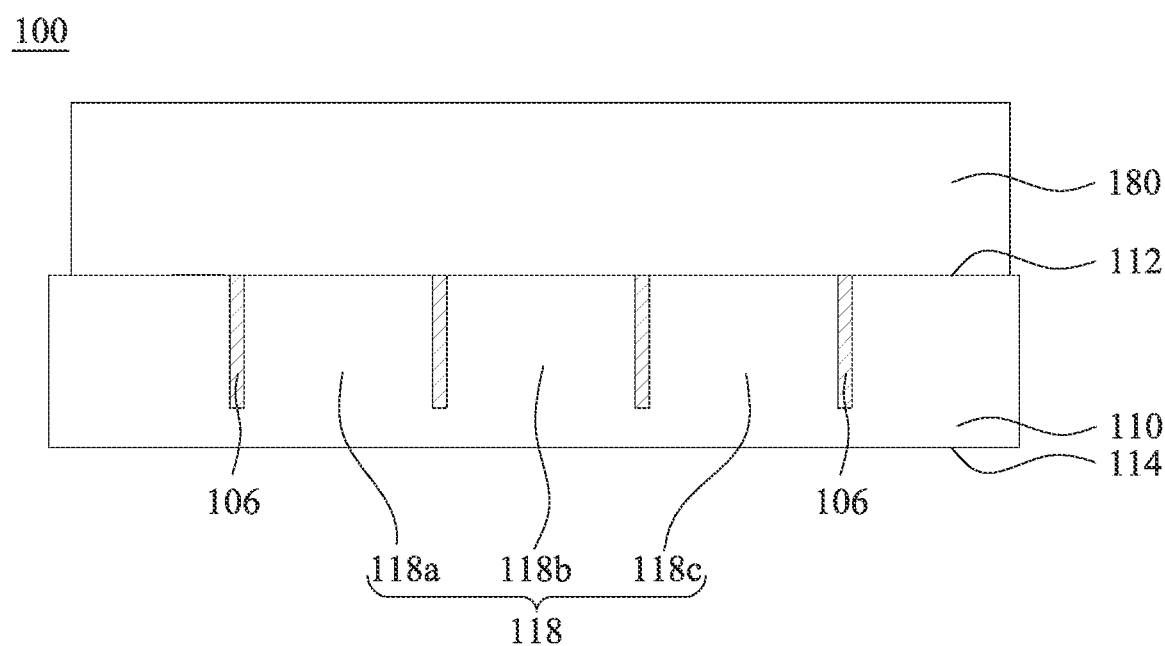

Reference is made to FIGS. 13A and 13B. FIG. 13A illustrates a simplified top view for manufacturing an image sensor device 100 at various stages in accordance with some embodiments, and FIG. 13B is a cross-sectional view taken along line B'-B' in FIG. 13A. After the third photoresist layer 160 in FIGS. 11A and 11B has been removed, a fourth photoresist layer 180 is formed over the front side 112 of the device substrate 110. The fourth photoresist layer 180 may be formed by depositing (e.g., spin-coating) a photoresist film over the front side 112 of the device substrate 110 and thereafter patterning the photoresist film by a fourth lithography process in the same fashion as discussed above with respect to FIGS. 1C-4B. The fourth lithography process used to pattern the fourth photoresist layer 180 is similar to the third lithography process used for the third photoresist layer 160 except that the fourth lithography process uses a fourth photomask, which has a pattern that is about half mask pitch offset from the third pattern 232 of the third photomask 230, to pattern the fourth photoresist layer 180.

Figure 13C:
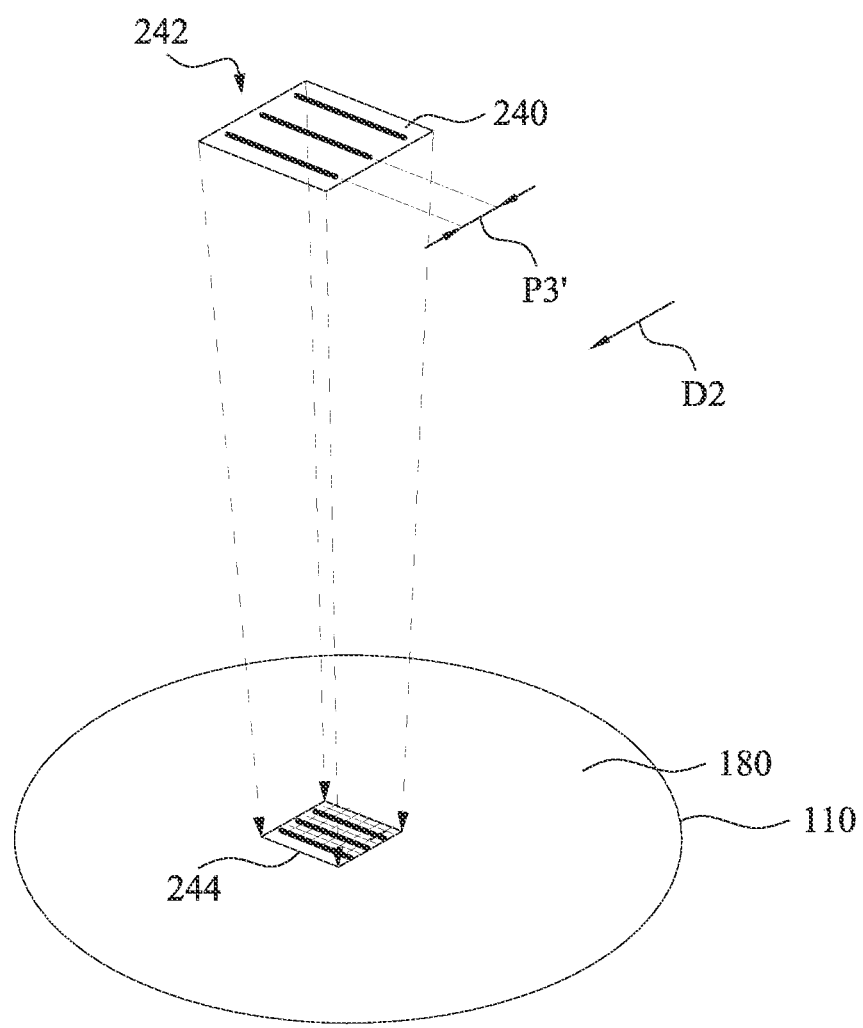

FIG. 13C illustrates a simplified top view of a fourth photomask 240 having a fourth pattern 242 in accordance with some embodiments. The fourth photomask 240 is substantially identical to the third photomask 230 except that the fourth pattern 242 is laterally shifted (in the second direction D2) by substantially a half mask pitch from the third pattern 232. The first, second, and third isolation regions are depicted in dashed line for illustration purposes only. Like the third pattern 232 in FIG. 9C, the fourth pattern 242 may be a pattern of substantially parallel lines having a constant mask pitch P3' greater than about 1 micrometer, such as about 1.15 micrometers to about 3 micrometers, for example about 1.2 micrometers to about 1.9 micrometers. In some embodiments, the pattern of substantially parallel lines has a mask pitch P3' of about 1.8 micrometers. Laterally shift of the fourth pattern 242 allows pixel regions to be formed in the device substrate 110 in a parallel-lines arrangement. In some embodiments, the mask pitches P3 (see FIG. 9C) and P3' may be substantially the same.

While a laterally shift of the fourth pattern 242 is discussed, the fourth pattern 242 may be offset by a half mask pitch from the third pattern 232 in any desired direction such as in a lateral way to double the density of the isolation regions in the device substrate 110, as will be discussed in more detail below. In addition, it is understood that the fourth pattern 242 is not limited to the pattern of substantially parallel lines as shown. The fourth pattern 242 may be any other arrangements of patterns and works with the third pattern 232 so that the fourth photoresist layer 240 is patterned to provide 2 photoresist columns having a resist pitch greater than 1 micrometer, for example about 1.2 micrometers to about 1.9 micrometers.

During the second lithography process, the mask stage is operable to secure the fourth photomask 240 and manipulate the photomask in transitional and/or rotational modes. The substrate stage holding the device substrate 110 may also be manipulated in transitional and/or rotational modes. An alignment device is used to align the photomask and the device substrate 110 so that the radiation beam exposes a field 244 on the device substrate 110. The radiation beam, such as a Krypton Fluoride (KrF) excimer laser with wavelength of 248 nm or an Argon Fluoride (ArF) excimer laser with a wavelength of 193 nm, may scan over the second photomask 220 to expose the field 244 on the device substrate 110. As such, the fourth pattern 242 is transferred onto the fourth photoresist layer 180 at the exposure field 244. The lithography apparatus steps the device substrate 110 to a next field (e.g., one scanning field) to expose another field. This step-and-scan process may be performed in the same fashion as the third lithography process until the pixel array region of the device substrate 110 is exposed with the fourth pattern 242.

While two different photomasks (i.e., third and fourth photomasks 230 and 240) are used to pattern the third and fourth photoresist layers 160 and 180, respectively, it is contemplated that the third and fourth lithography processes may use the same photomask to pattern the third and fourth photoresist layers 160 and 180 by moving either the mask stage or the substrate stage to achieve the half mask pitch offset movement.

Figure 14A:
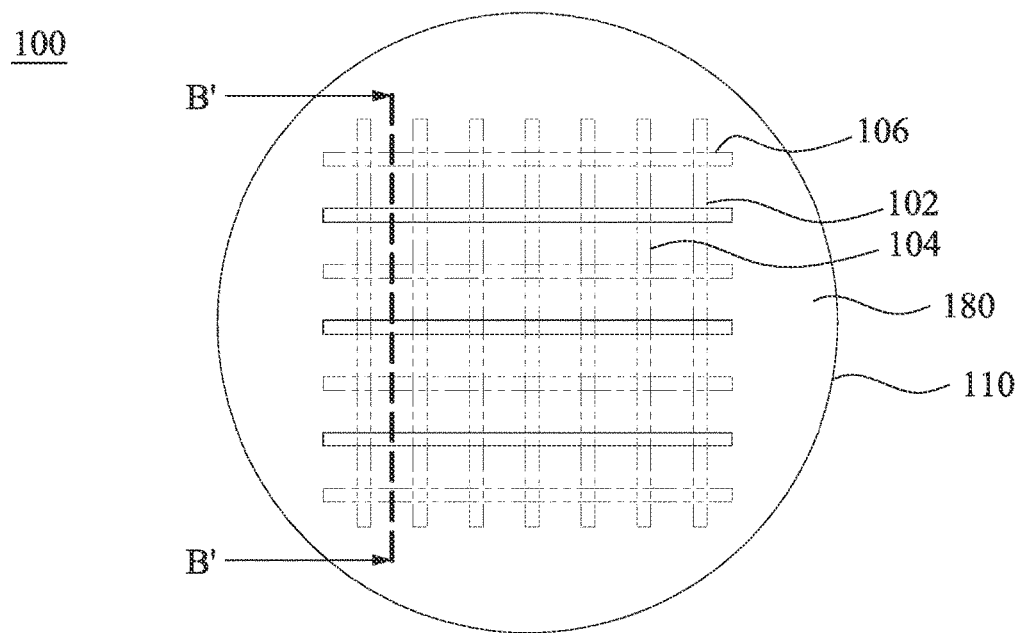
Figure 14B:
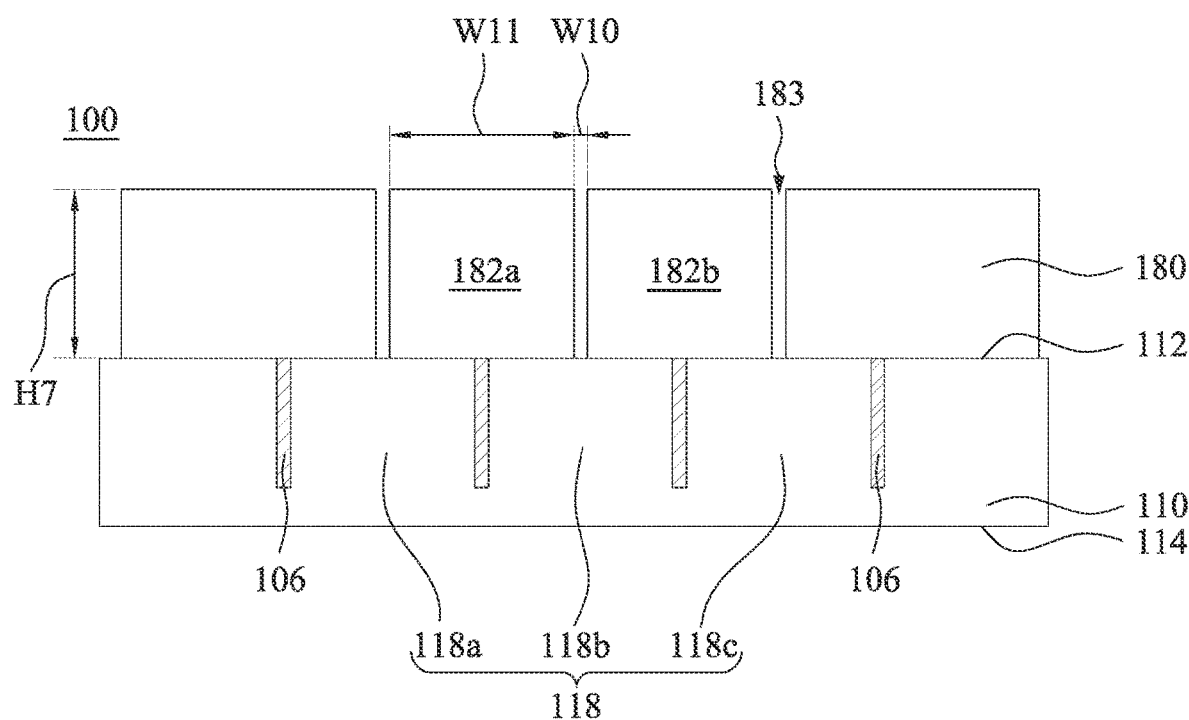

Reference is made to FIGS. 14A and 14B. FIG. 14A illustrates a simplified top view for manufacturing an image sensor device 100 at various stages in accordance with some embodiments, and FIG. 14B is a cross-sectional view taken along line B'-B' in FIG. 14A. As can be seen, the fourth pattern 242 has been transferred to the fourth photoresist layer 180 to form fourth photoresist columns 182a and 182b on the front side 112 of the device substrate 110. While not shown, it is understood that the patterned photoresist layer 180 has the pattern of substantially parallel lines similar to the arrangement of the third photoresist columns 162a, 162b, and 162c shown in FIGS. 10A and 10B except that the fourth photoresist columns 182a and 182b are offset laterally by half pitch from the third photoresist columns 162a, 162b, and 162c.

The fourth photoresist columns 182a and 182b are separated by a trench 183. The trench 183 has a height H7 (vertical dimension), which equals to the height of the fourth photoresist columns 182a and 182b, and a width W10 (lateral dimension). The trench 183 has substantially the same aspect ratio as that of the trench 163. For example, the trench 183 may have an aspect ratio of 10:1 or above, such as about 12:1 to about 30:1, for example about 13:1 to about 25:1. In some embodiments, the trench 183 has an aspect ratio of 15:1 to 20:1. Similarly, for a pixel size on the order of about 1 micrometer, each of the fourth photoresist columns 182a and 182b may have an aspect ratio of about 1:1 to about 3:1 or lower, such as about 2:1. In some embodiments, each of the fourth photoresist columns 182a and 182b has an aspect ratio of about 1:1. Therefore, the aspect ratio of the fourth photoresist columns 182a and 182b is lower than the aspect ratio of the trench 183. In various embodiments, the width W11 of each of the fourth photoresist columns 182a and 182b to the width W10 of the trench 183 may be at a ratio of about 4:1 to about 30:1, such as about 6:1 to about 20:1, for example about 8:1 to about 10:1.

Similarly, while the trench 183 has an ultrahigh aspect ratio of 10:1 or above, for example 13:1, 15:1 or above, the fourth photoresist columns 182a and 182b have sufficient strength to withstand the capillary forces inside the trench 183 without collapsing due to the lower aspect ratio of the fourth photoresist columns 182a and 182b. Specifically, ultrahigh aspect ratio trench and lower aspect ratio of the fourth photoresist columns 182a and 182b result in the increased width W11 of each of the fourth photoresist columns 182a and 182b, which leads to good adhesion of the fourth photoresist columns 182a and 182b to the front side 112 of the device substrate 110. Therefore, the likelihood of the fourth photoresist columns 182a and 182b collapsing is reduced as compared to those high aspect ratio photoresist layers having a trench aspect ratio of 10:1 or greater. This means that the fourth photoresist columns 182a and 182b can be formed taller or closer together (i.e., having a higher aspect ratio trench between the fourth photoresist columns 182a and 182b) without risking the fourth photoresist columns 182a and 182b collapse. The combination of the lower aspect ratio of the fourth photoresist columns 182a and 182b (such as about 3:1 or lower) and an ultrahigh aspect ratio trench (such as 13:1 or greater) are advantageous in performing subsequent fabrication processes such as formation of fourth isolation regions by ion implantation.

In some embodiments, the likelihood of the fourth photoresist columns 182a and 182b collapsing can be further decreased by applying a shrinkage material to the exposed surfaces of the fourth photoresist columns 182a and 182b, which will be discussed in more detail in FIGS. 20A and 20B.

Figure 15A:
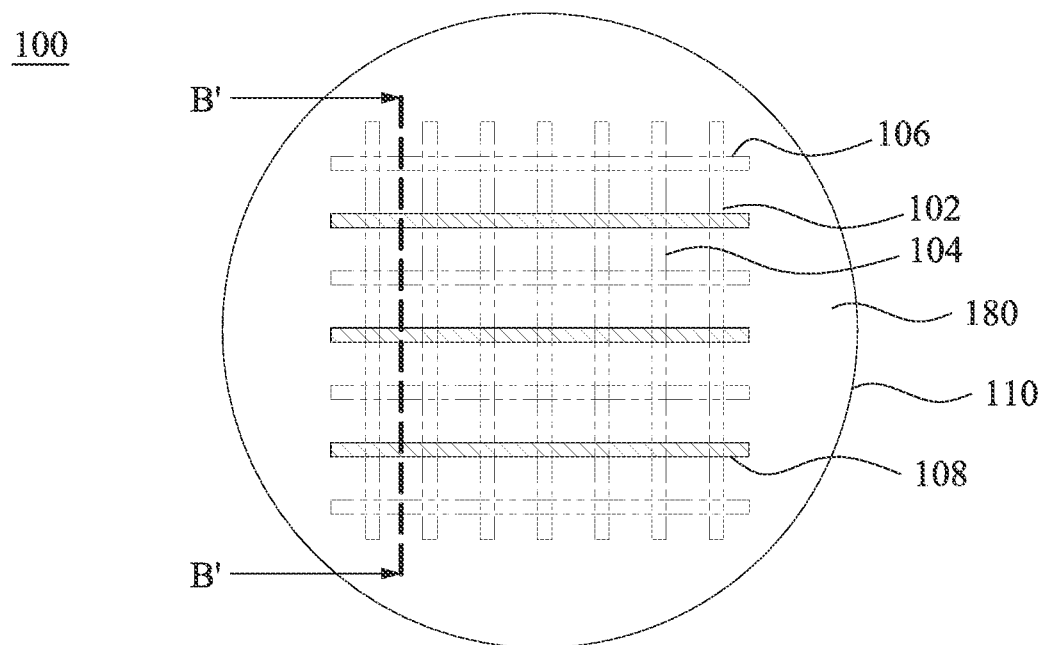
Figure 15B:
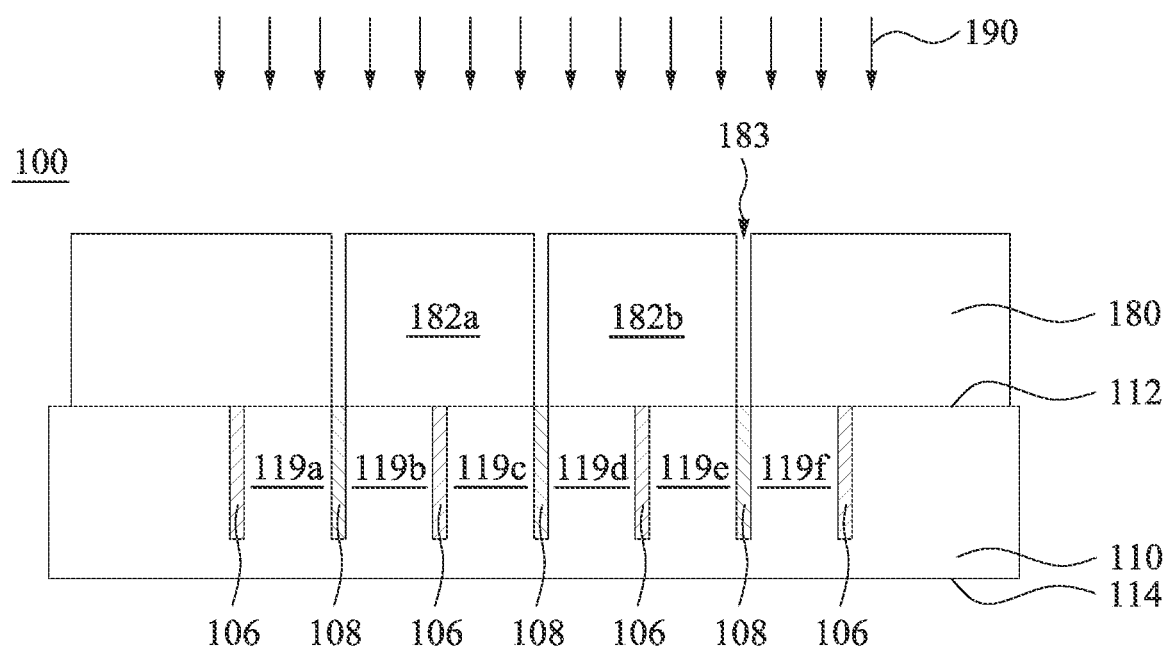

Reference is made to FIGS. 15A and 15B. FIG. 15A illustrates a simplified top view for manufacturing an image sensor device 100 at various stages in accordance with some embodiments, and FIG. 15B is a cross-sectional view taken along line B'-B' in FIG. 15A. After the fourth lithography process, the device substrate 110 is subjected to a fourth ion implantation process 190 to form fourth isolation regions 108 in the device substrate 110. The fourth ion implantation process 190 is performed using the fourth photoresist columns 182a and 182b as a mask to implant ions into regions of the device substrate 110 that are not protected by the fourth photoresist columns 182a and 182b. Since the fourth photoresist columns 182a and 182b are offset by half pitch from the third photoresist columns 162a, 162b, and 162c, the resulting fourth isolation regions 108 will divide each of the pixel regions 119a, 119b, and 119c in half and separate the divided pixel regions from each other. The fourth isolation regions 108 prevent carriers at a specific pixel region from leakage to adjacent pixel region. The fourth isolation regions 108 may exceed the depth of each pixel to be formed in the divided pixel regions. In some embodiments, the fourth isolation regions 108 may extend from the front side 112 to the back side 114 of the device substrate 110 to provide isolation well between the divided pixel regions. Since the fourth photoresist columns 182a and 182b are formed with ultrahigh aspect ratio trench between the fourth photoresist columns 182a and 182b, deeper isolation regions can be achieved with limited implant damages to the image sensor device (e.g., isolation regions can be formed with minimum lateral diffusion) even if high implantation energies are used. As a result, the ions can be implanted deeper to provide an effective pixel-to-pixel isolation for the image sensor device 100.

Each fourth isolation region 108 has a height H8 (vertical dimension) and a width W12 (lateral dimension). An aspect ratio of the fourth isolation region 108 may be defined as a ratio of the height H8 to the width W12. In some embodiments, the fourth isolation region 108 have an aspect ratio of 10:1 or above, for example about 12:1 to about 15:1. Since the first, second, third, and fourth isolation regions 102, 104, 106, and 108 are formed separately, the height H8 of the fourth isolation region 108 may be different from the height H2 of the first isolation regions 102 (see FIG. 3B), the height H4 of the second isolation regions 104 (see FIG. 7B), and/or the height H6 of the third isolation region 106 (see FIG. 11B). Alternatively, the height H8 of the fourth isolation regions 108 may be substantially the same as the height H2 of the first isolation regions 102, the height H4 of the second isolation regions 104, and/or the height H6 of the third isolation region 106.

Similar to the third isolation regions 106, the fourth isolation regions 108 may be formed of p-type or n-type materials and contain the same doping polarity as the device substrate 110 and/or the first, second, and third isolation regions 102, 104, and 106. For example, the fourth isolation regions 108 may be p-type regions formed by implanting the device substrate 110 with p-type dopants such as boron, boron fluoride ($BF_2$), diborane ($B_2H_6$), or the like. The doping concentration of the fourth isolation regions 108 may be of approximately $1\times10^{12}$ ions/cm$^3$ and up to approximately $5\times10^{17}$ ions/cm$^3$, like the third isolation regions 106. Each fourth isolation region 108 may have an aspect ratio of 10:1 or above, for example about 12:1 to about 15:1. Further, the fourth isolation regions 108 cross over the first and second isolation regions 102 and 104, and the crossing portions thereof has a doping concentrations greater than the doping concentrations of the first, second, and/or third isolation regions 102, 104, and/or 106. For example, the crossing portion has a doping concentration substantially double the doping concentration of individually first, second, and fourth isolation regions 102, 104, and 108. In addition, the third and fourth isolation regions 106 and 108 are spaced apart from each other.

In cases where the fourth pattern 242 in FIG. 13C uses a pattern of substantially parallel lines having a mask pitch of about 1.8 micrometers, the fourth lithography process and the fourth ion implantation process 190 will form fourth isolation regions 108 and the third isolation regions 106 at a constant pitch P4' of about 0.9 micrometers, which is at sub-micrometer levels. By performing two lithography processes (i.e., two mask patterning process), the density of the pixel regions (such as pixel regions 119a-119f shown in FIGS. 15A and 15B) can be increased by more than double. Particularly, the lithography processes are performed using photoresist columns with ultrahigh aspect ratio trench (e.g., greater than 13:1) without the risk of photoresist pattern collapsing.

Figure 16A:
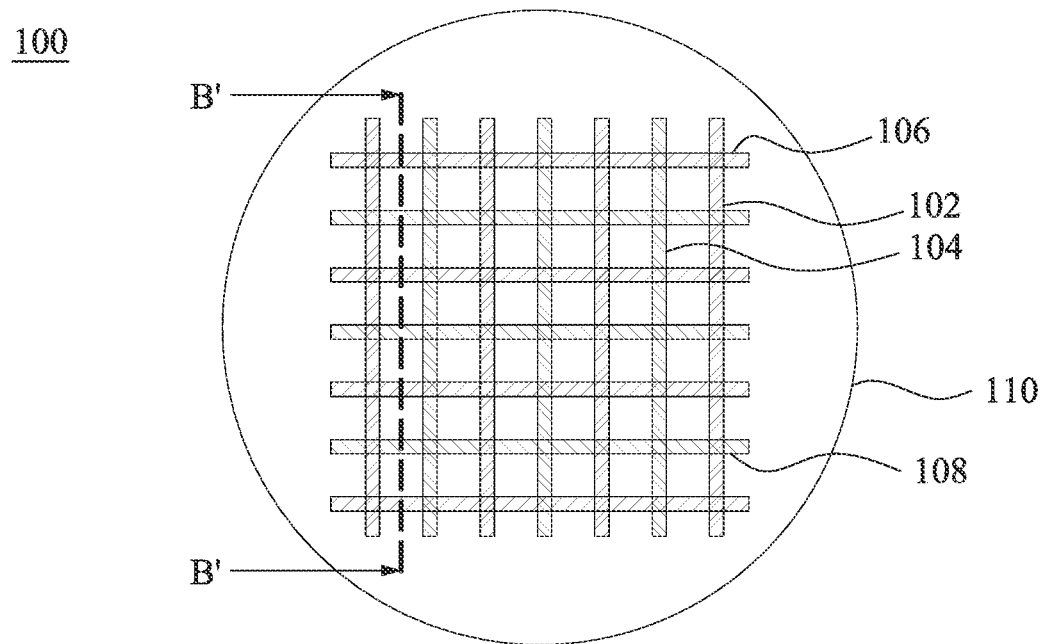
Figure 16B:
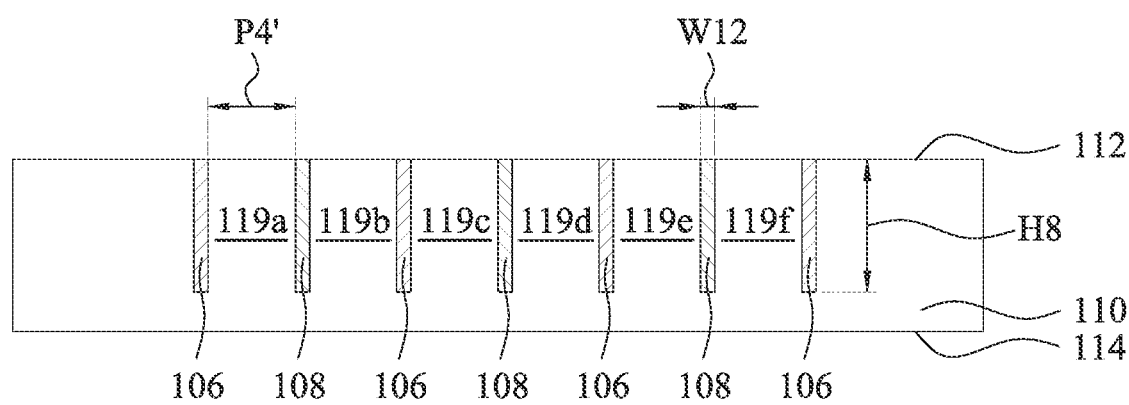

Reference is made to FIGS. 16A and 16B. FIG. 16A illustrates a simplified top view for manufacturing an image sensor device 100 at various stages in accordance with some embodiments, and FIG. 16B is a cross-sectional view taken along line B'-B' in FIG. 16A. After the fourth isolation regions 108 have been formed, the fourth photoresist columns 182a, 182b, and 182c are removed, for example, using a photoresist ashing or stripping process. It is contemplated that the processes described above can be repeated to obtain high density of isolation regions at sub-micrometer pitch or even below.

Figure 17A:
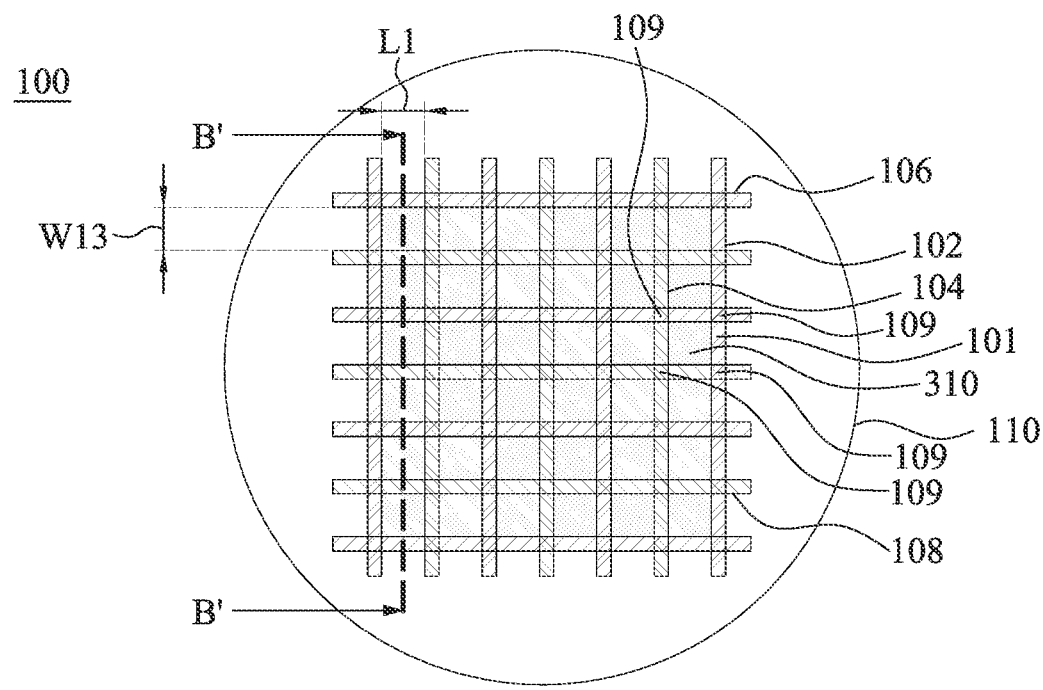
Figure 17B:
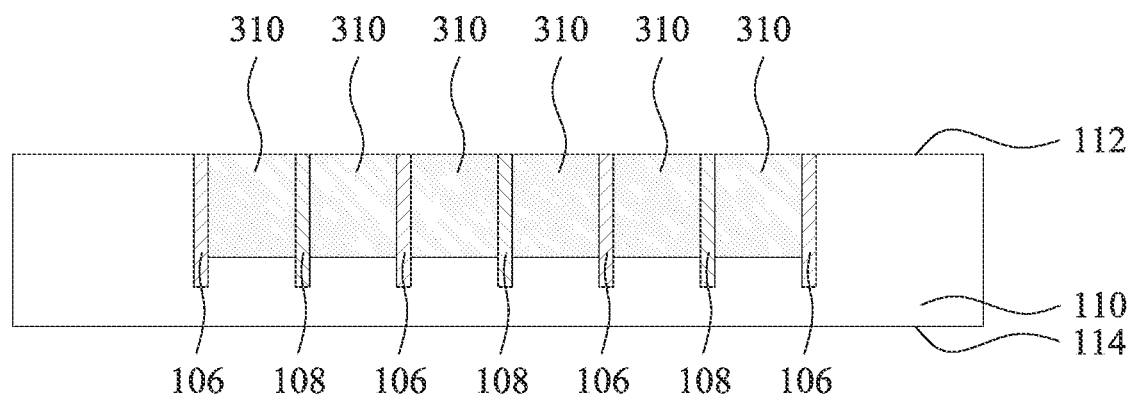

Reference is made to FIGS. 17A and 17B. FIG. 17A illustrates a simplified top view for manufacturing an image sensor device 100 at various stages in accordance with some embodiments, and FIG. 17B is a cross-sectional view taken along line B'-B' in FIG. 17A. After the fourth photoresist columns 182a and 182b have been removed, a plurality of pixels 310 is formed in the pixel regions 119a-119f (see FIG. 16B), respectively, as shown in FIGS. 17A and 17B. The pixels 310 may also be referred to as radiation-detection devices or light-sensors. The pixels 310 contain radiation-sensing regions. These radiation-sensing regions may be formed by one or more ion implantation processes and are doped with a doping polarity opposite from that of the device substrate 110 and/or the first, second, third, and fourth isolation regions 102, 104, 106, and 108. In cases where the device substrate 110 is p-type substrate, the pixels 310 contain n-type doped regions. For a BSI image sensor device such as the image sensor device 100, the pixels 310 are operable to detect radiation that is projected toward the device substrate 110 from the back side 114. In some embodiments, each of the pixels 310 includes a photodiode. A deep implant region may be formed below each photodiode in some embodiments. In some other embodiments, the pixels 310 may each include pinned layer photodiodes, photogates, reset transistors, source follower transistors, and transfer transistors.

In FIG. 17A, each of the pixels 310 has a length L1 and a width W13. The length L1 is defined by adjacent first and second isolation regions 102 and 104, and the width W13 is defined by adjacent third and fourth isolation regions 106 and 108. The length L1 and the width W13 are at sub-micrometer levels. For example, the length L1 and the width W13 are about 0.75 micrometers to about 0.95 micrometers. In some embodiments, the length L1 is substantially the same as the width W13. Alternatively, the length L1 is greater or less than the width W13.

Crossing portions 109 of the first, second, third, and fourth isolation regions 102, 104, 106, and 108 are respectively at corners of the pixel 310. As mentioned above, the crossing portions 109 have doping concentrations greater than the doping concentration of the individual first, second, third, and fourth isolation regions 102, 104, 106, and 108, e.g., the portion 101 on a sidewall of the pixel 310. The crossing portions 109 may have doping concentrations about twice than that of the portion 101.

Figure 18A:
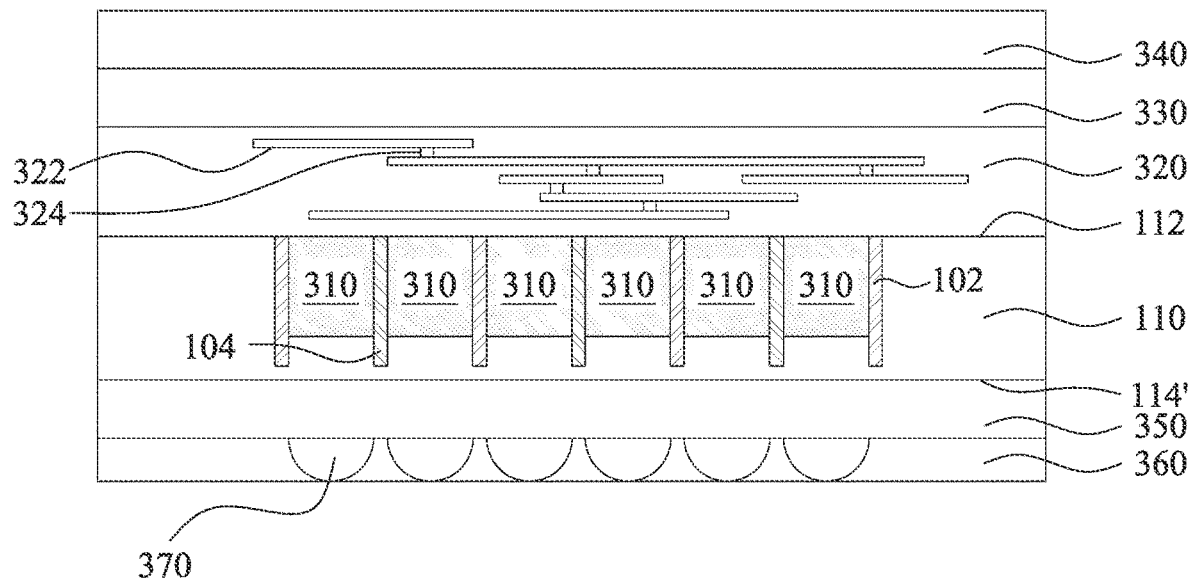
Figure 18B:
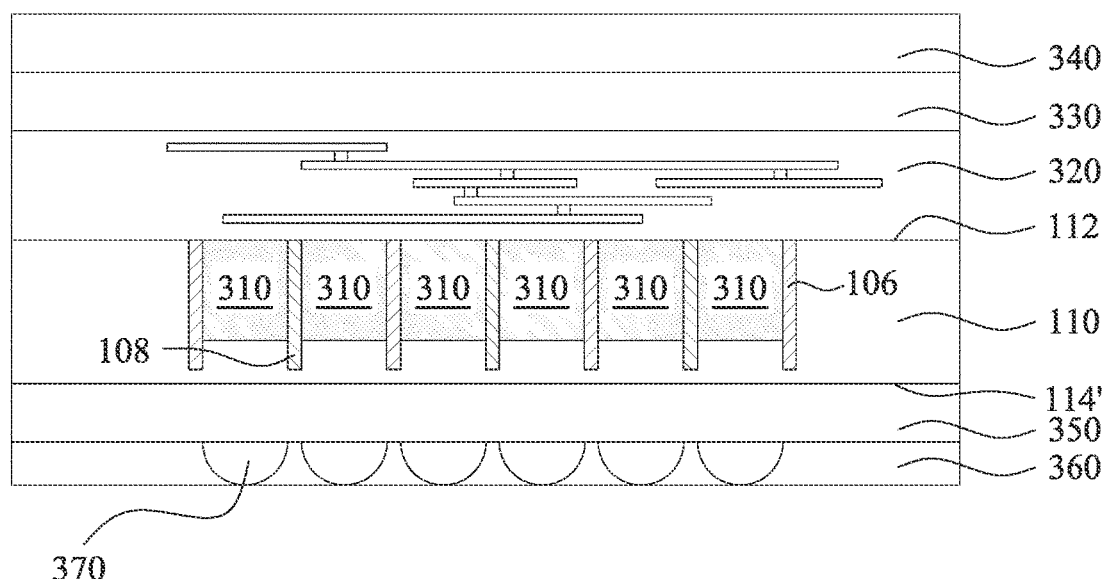

Additional fabrication processes may be performed to complete the fabrication of the image sensor device 100. For example, FIGS. 18A and 18B illustrate cross-sectional views of the image sensor device 100 according to some embodiments. FIG. 18A has a cross-sectional position the same as FIG. 8B, and FIG. 18B has a cross-sectional position the same as FIG. 17B. In FIGS. 18A and 18B, an interconnect structure 320 is formed over the front side 112 of the device substrate 110. The interconnect structure 320 may include a plurality of patterned dielectric layers and conductive layers that provide interconnections between the various doped features, circuitry, and input/output of the image sensor device 100. The interconnect structure 320 may include an interlayer dielectric (ILD) and a multilayer interconnect (MLI) structure. The MLI structure includes contacts, vias and metal lines. For purposes of illustration, a plurality of conductive lines 322 and vias/contacts 324 are shown in FIGS. 18A and 18B. It is understood that the conductive lines 322 and vias/contacts 324 illustrated are merely exemplary as the actual positioning and configuration of the lines/vias/contacts may vary depending on design needs and manufacturing requirements.

A buffer layer 330 may be formed on the interconnect structure 320. The buffer layer 330 may include a dielectric material such as silicon oxide or silicon nitride. Thereafter, a carrier substrate 340 may be bonded with the device substrate 110 via the buffer layer 330 so that processing of the back side 114 of the device substrate 110 can be performed. The carrier substrate 340 may include a silicon substrate, a glass substrate, or any suitable substrate. The buffer layer 330 provides electrical isolation between the device substrate 110 and the carrier substrate 340. The carrier substrate 340 provides support and mechanical strength for processing of the back side 114 of the device substrate 110.

After the carrier substrate 340 is bonded, a thinning process is then performed to thin the device substrate 110 from the back side 114. The thinning process may include a mechanical grinding process and a chemical thinning process. After the thinning process, a color filter layer 350 may be formed on the back side 114' of the device substrate 110. The color filter layer 350 may contain a plurality of color filters that may be positioned such that the incoming radiation is directed thereon and therethrough. The color filters may include a dye-based (or pigment based) polymer or resin for filtering a specific wavelength band of the incoming radiation, which corresponds to a color spectrum (e.g., red, green, and blue). Thereafter, a micro-lens layer 360 containing a plurality of micro-lenses 370 is formed over the color filter layer 350. The micro-lenses direct and focus the incoming radiation toward specific radiation-sensing regions in the device substrate 102, such as pixels 310. The micro-lenses may be positioned in various arrangements and have various shapes depending on a refractive index of a material used for the micro-lens and distance from a sensor surface. It is understood that the sequence of the fabrication processes described above is not intended to be limiting. Some of the layers or devices may be formed according to different processing sequences in other embodiments than what is shown herein. While the above discussions pertain to a BSI image sensor device, it is contemplated that the various aspects of the present disclosure may be applied to a front side illuminated (FSI) image sensor device as well.

FIGS. 19A and 19B are a flow chart illustrating an exemplary method M for fabricating an image sensor device according to various embodiments of the present disclosure. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, a first lithography process is performed using a first pattern of a first photomask to form first photoresist columns on a front side of a device substrate. FIGS. 1A-2B illustrate top views and cross-sectional views of some embodiments corresponding to act in block S12. At block S14, a first ion implantation process is performed using the first photoresist columns as a mask to implant first isolation regions in the device substrate. FIGS. 3A-4B illustrate top views and cross-sectional views of some embodiments corresponding to act in block S14. At block S16, a second lithography process is performed using a second pattern of a second photomask to form second photoresist columns on the front side of the device substrate. FIGS. 5A-6B illustrate top views and cross-sectional views of some embodiments corresponding to act in block S16. At block S18, a second ion implantation process is performed using the second photoresist columns as a mask to implant second isolation regions in the device substrate, wherein the first and second isolation regions are spaced apart from each other. FIGS. 7A-8B illustrate top views and cross-sectional views of some embodiments corresponding to act in block S18.

At block S20, a third lithography process is performed using a third pattern of a third photomask to form third photoresist columns on the front side of the device substrate. FIGS. 9A-10B illustrate top views and cross-sectional views of some embodiments corresponding to act in block S20. At block S22, a third ion implantation process is performed using the third photoresist columns as a mask to implant third isolation regions in the device substrate, wherein the third isolation regions cross over the first and second isolation regions. FIGS. 11A-12B illustrate top views and cross-sectional views of some embodiments corresponding to act in block S22. At block S24, a fourth lithography process is performed using a fourth pattern of a fourth photomask to form fourth photoresist columns on the front side of the device substrate. FIGS. 13A-14B illustrate top views and cross-sectional views of some embodiments corresponding to act in block S24. At block S26, a fourth ion implantation process is performed using the fourth photoresist columns as a mask to implant fourth isolation regions in the device substrate, wherein the fourth isolation regions cross over the first and second isolation regions and spaced apart from the third isolation regions. FIGS. 15A-16B illustrate top views and cross-sectional views of some embodiments corresponding to act in block S26. The first, second, third, and fourth isolation regions define pixel regions having a pixel region pitch at sub-micrometer levels (e.g., about 0.75 micrometers to about 0.95 micrometers).

At block S28, pixels are respectively formed in the pixel regions of the device substrate. FIGS. 17A-17B illustrate a top view and a cross-sectional views of some embodiments corresponding to act in block S28. At block S30, an interconnect structure, a buffer layer, and a carrier substrate are subsequently formed on the front side of the device substrate. At block S32, a color filter layer and a micro-lens layer are subsequently formed on the back side of the device substrate. FIGS. 18A-18B illustrate cross-sectional views of some embodiments corresponding to act in blocks S30 and S32.

In some embodiments, a shrinkage material may be optionally applied to first, second, third, and/or fourth photoresist columns $122a$-$122c$, $142a$-$142b$, $162a$-$162c$, and/or $182a$-$182b$ shown in FIGS. 2B, 6B, 10B, and 14B, respectively, to further prevent collapsing of photoresist columns due to capillary forces. For simplicity, the description herein will use first photoresist columns $122a$-$122c$ as an example.

Figure 20A:
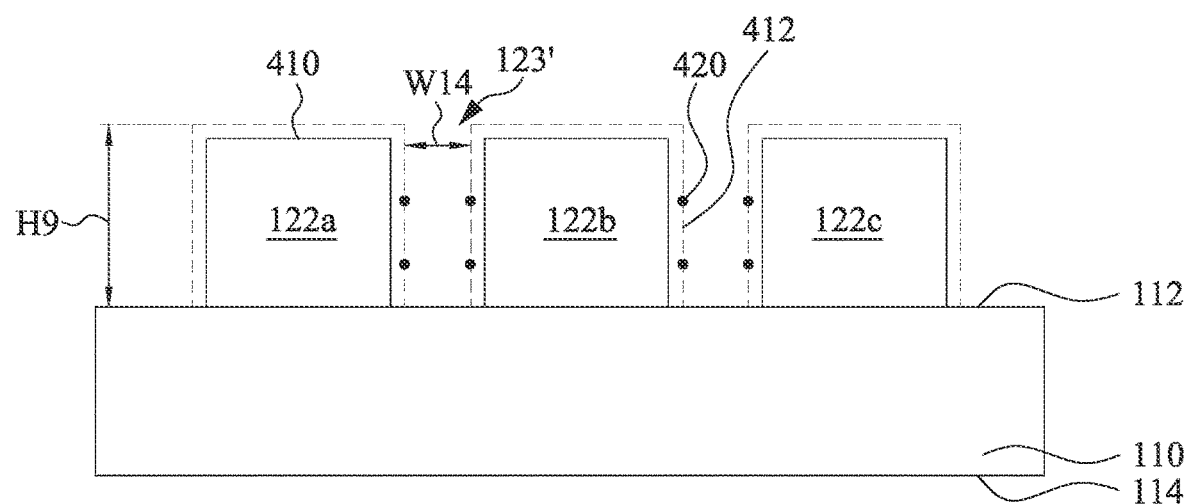
FIGS. 20A and 20B illustrate simplified cross-sectional views for manufacturing an image sensor device at various stages in accordance with some embodiments.
Figure 20B:
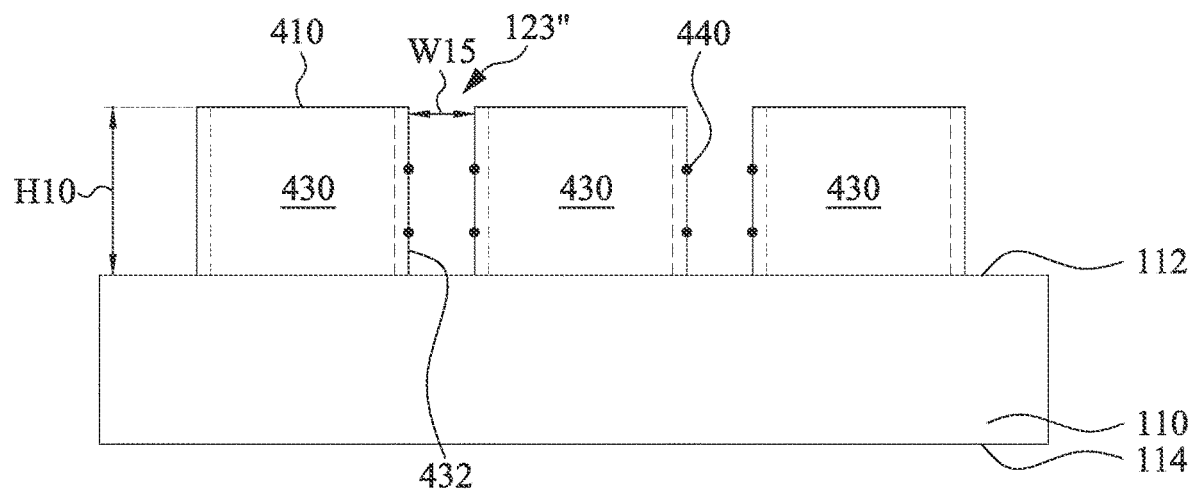

FIGS. 20A and 20B illustrate simplified cross-sectional views for manufacturing an image sensor device 100 at various stages in accordance with some embodiments. After the first photoresist columns $122a$-$122c$ as have been formed, the first photoresist columns $122a$-$122c$ are exposed to a shrinkage material using a suitable technology such as a spin-coating process. The shrinkage material may be produced by mixing surfactant particles uniformly in a chemical material. The surfactant particles include compounds or molecules that lower the surface tension between liquids or between a liquid and a solid. For example, a surfactant particle includes a molecule having one end that is water-soluble and an opposite end that is oil-soluble. The surfactant molecules may aggregate to form micelles. In some embodiments, each of the surfactant particles includes a fluorinated compound. In some other embodiments, the surfactant particles include a hydrocarbon compound.

In some embodiments, the chemical material includes a "resolution enhancement lithography assisted by chemical shrinkage" material (or RELACS). The RELACS material includes a water-soluble material (e.g., a polymer) having thermal cross-linking properties. In some other embodiments, the chemical material includes a "shrink assist film for enhanced resolution" material (or SAFIER) developed by Tokyo Ohka Kogyo Co. The SAFIER material includes an aqueous solution that contains thermo-responsive polymers that facilitate photoresist flow during a baking process. The SAFIER material may or may not react with the photoresist chemically but provides mechanical support to the sidewalls of the photoresist as it flows. The mechanical support provided by the SAFIER material minimizes photoresist column profile degradation. The SAFIER material can be removed in a developing process following the baking.

In some exemplary embodiments, the shrinkage material containing RELACS material discussed above is applied on the first photoresist columns $122a$-$122c$. A portion of the RELACS material applied on the first photoresist columns $122a$-$122c$ can become cross-linked to the photoresist columns $122a$-$122c$ and form a cross-linking film 410 on exposed surfaces of the photoresist columns $122a$-$122c$ during a baking process, as shown in FIG. 20A. The cross-linking films 410 may be viewed as a part of the enlarged photoresist columns $122a$-$122c$ when they are used as a mask in the subsequent ion implantation process. The rest of the unreacted (e.g., un-cross-linked) RELACS material are removed in a developing process following the baking. Compared to the previous trench 123 shown in FIG. 2B, the reduced trench 123' has an increased height (vertical dimension) H9 and a reduced width (lateral dimension) W14. The reduced width W14 allows thinner isolation regions to be formed in the device substrate. For example, the first photoresist columns $122a$-$122c$ may be used as an ion implantation mask to form thinner isolation regions (and therefore wider pixel regions) for the image sensor device. In addition, the surfactant particles 420 of the shrinkage material that are disposed on or near the sidewalls 412 of the cross-linking films 410 reduce the surface tension of the sidewall surfaces. Capillary force is correlated with (or is a function of) the surface tension. Since the surface tension on the sidewalls 412 is reduced by the presence of the surfactant particles 420 disposed thereon, the capillary forces inside the trench 123' are reduced, which diminishes the risks of the first photoresist columns 122a-122c collapse.

In some other exemplary embodiments, the shrinkage material containing SAFIER material discussed above is applied on the first photoresist columns 122a-122c. The SAFIER material contains thermo-responsive polymers that facilitate flowing of the first photoresist columns 122a-122c during the baking process. In other words, the first photoresist columns 122a-122c flow outward laterally and are reshaped as photoresist columns 430, respectively. As shown in FIG. 20B, the sidewalls of the photoresist columns 430 before the flow occurs are illustrated herein as the broken lines. As can be seen, the sidewalls 432 of the reshaped photoresist columns 430 consequently move closer toward each other, thereby reducing the distance between the reshaped photoresist columns 430. The height H10 of the reshaped photoresist columns 430 is also reduced due to the lateral expansion. The shrinkage material (i.e., the SAFIER material) also provides some mechanical support to the sidewalls 432 of the reshaped photoresist columns 430 during the photoresist flow, thereby allowing the sidewalls 432 to maintain their shapes. Compared to the previous trench 123 shown in FIG. 2B, the reduced trench 123" has a reduced height (vertical dimension) H10 and a reduced width (lateral dimension) W15. The reduced width W15 allows thinner isolation regions to be formed in the device substrate. For example, the reshaped photoresist columns 430 may be used as an ion implantation mask to form thinner isolation regions (and therefore wider pixel regions) for the image sensor device.

At least some of the surfactant particles 440 of SAFIER that are disposed on (or near) the sidewalls 432 reduce surface tension of the sidewall 432. As discussed above, capillary force is correlated with (or is a function of) the surface tension. Since the surface tension on the sidewalls 432 is reduced by the presence of the surfactant particles 440 disposed thereon, the capillary forces contributing to collapse are reduced as well, which diminishes the risks of the first photoresist columns 122a-122c collapse.

Figure 21A:
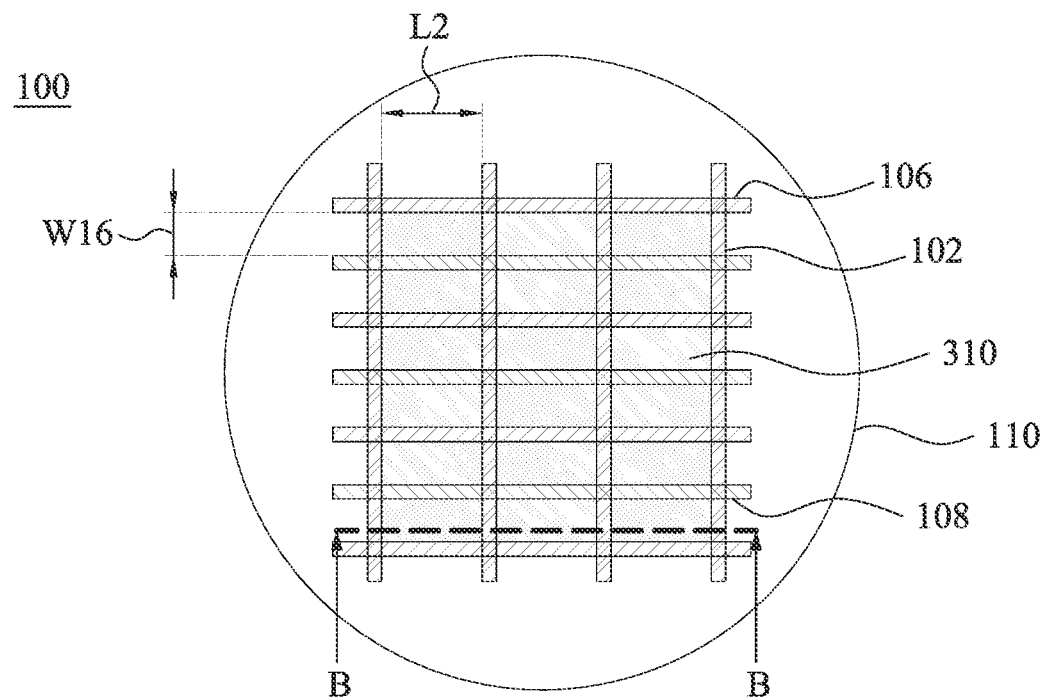
FIG. 21A illustrates a simplified top view for manufacturing an image sensor device at various stages in accordance with some embodiments.
Figure 21B:
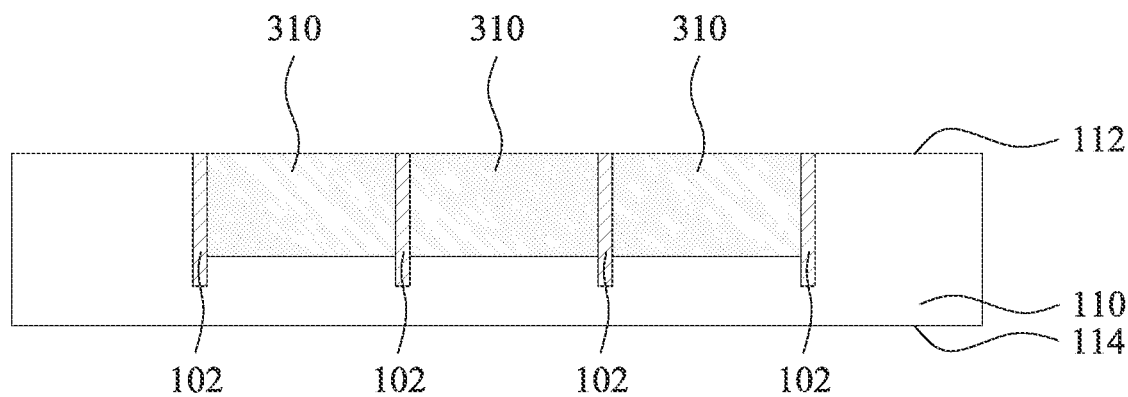
FIG. 21B is a cross-sectional view taken along line B-B in FIG. 21A.
Figure 22A:
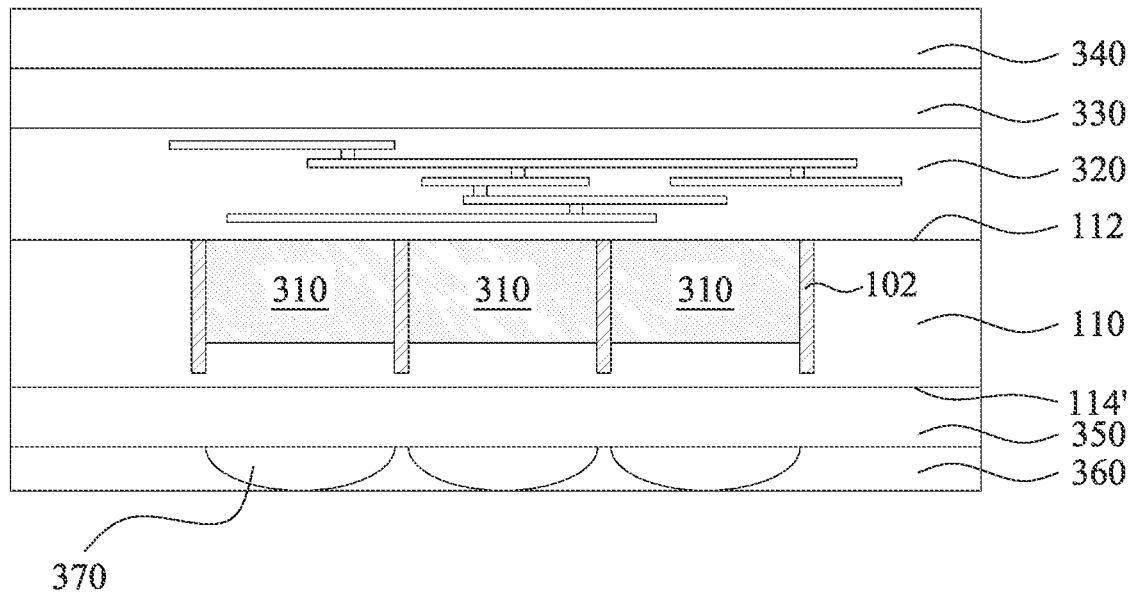
FIGS. 22A and 22B illustrate simplified cross-sectional views of an image sensor device in accordance with some embodiments.
Figure 22B:
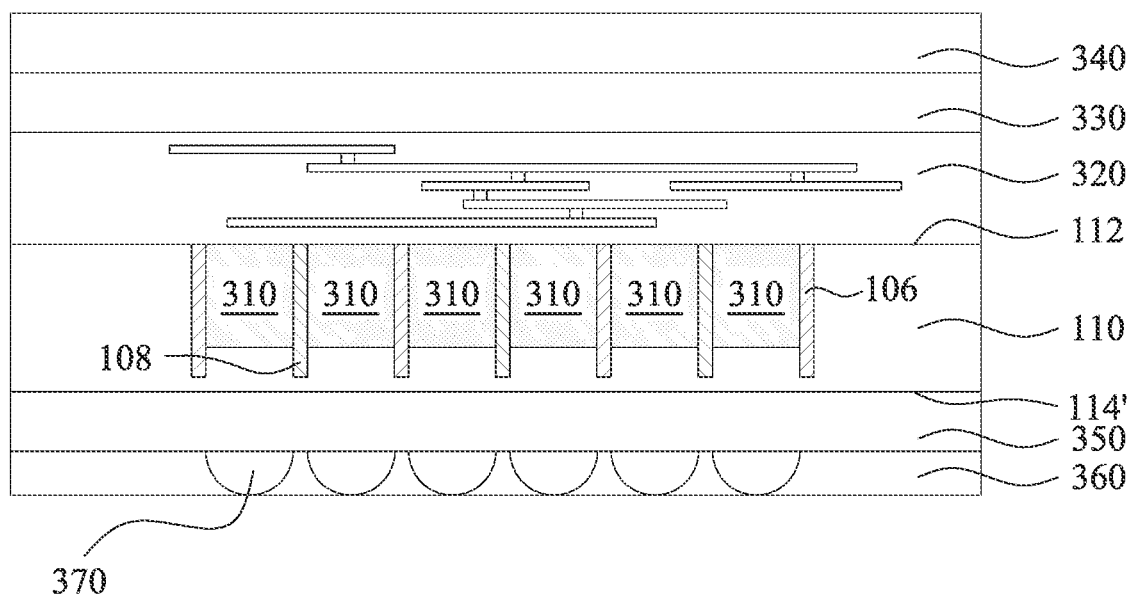

FIG. 21A illustrates a simplified top view for manufacturing an image sensor device 100 at various stages in accordance with some embodiments, and FIG. 21B is a cross-sectional view taken along line B-B in FIG. 21A. In some embodiments, the acts of blacks S16 and S18 are omitted. That is, second isolation regions are not formed in the device substrate 110. Therefore, each of the pixels 310 has a rectangular shape in a top view. Specifically, each of the pixels 310 has a length L2 and a width W16. The length L2 is defined by adjacent two first isolation regions 102, and the width W16 is defined by adjacent third and fourth isolation regions 106 and 108. The length L2 is greater than the width W16 and is above sub-micrometer levels. For example, the length L2 is greater than about 1 micrometer, such as about 1.15 micrometers to about 3 micrometers, for example about 1.2 micrometers to about 1.9 micrometers. The width W16 is at sub-micrometer level. For example, the width W16 is about 0.75 micrometers to about 0.95 micrometers. After the pixels 310 are formed, additional fabrication processes may be performed to complete the fabrication of the image sensor device 100 as shown in FIGS. 22A and 22B, where FIG. 22A has a cross-sectional position the same as FIG. 21B, and FIG. 22B has a cross-sectional position the same as FIG. 18B. Other relevant structural details of the image sensor device in FIGS. 22A and 22B are similar to the image sensor device in FIGS. 18A and 18B, and, therefore, a description in this regard will not be repeated hereinafter.

Figure 23A:
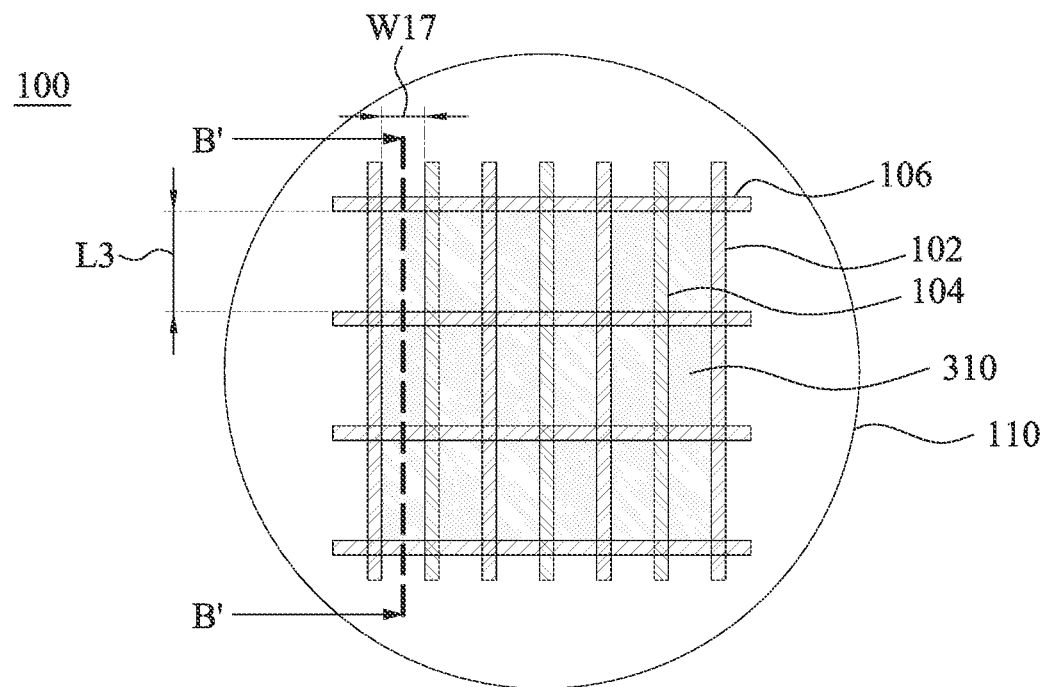
FIG. 23A illustrates a simplified top view for manufacturing an image sensor device at various stages in accordance with some embodiments.
Figure 23B:
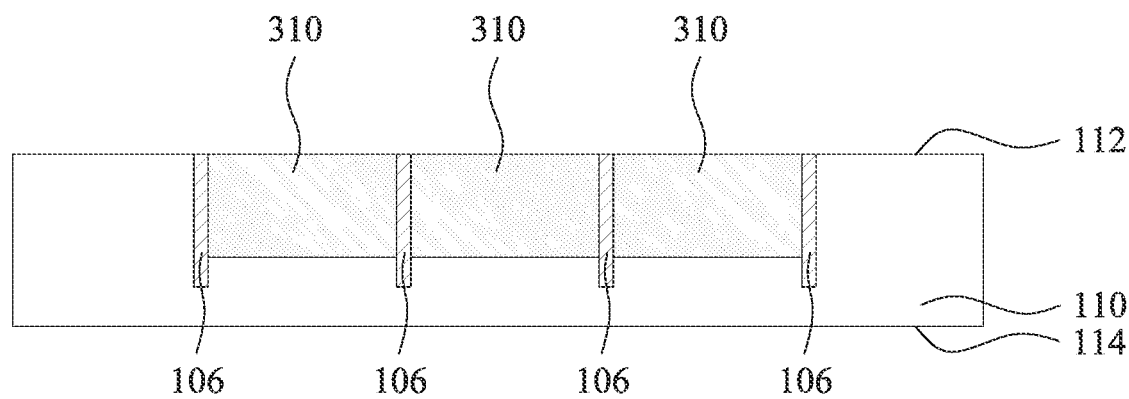
FIG. 23B is a cross-sectional view taken along line B-B in FIG. 23A.
Figure 24A:
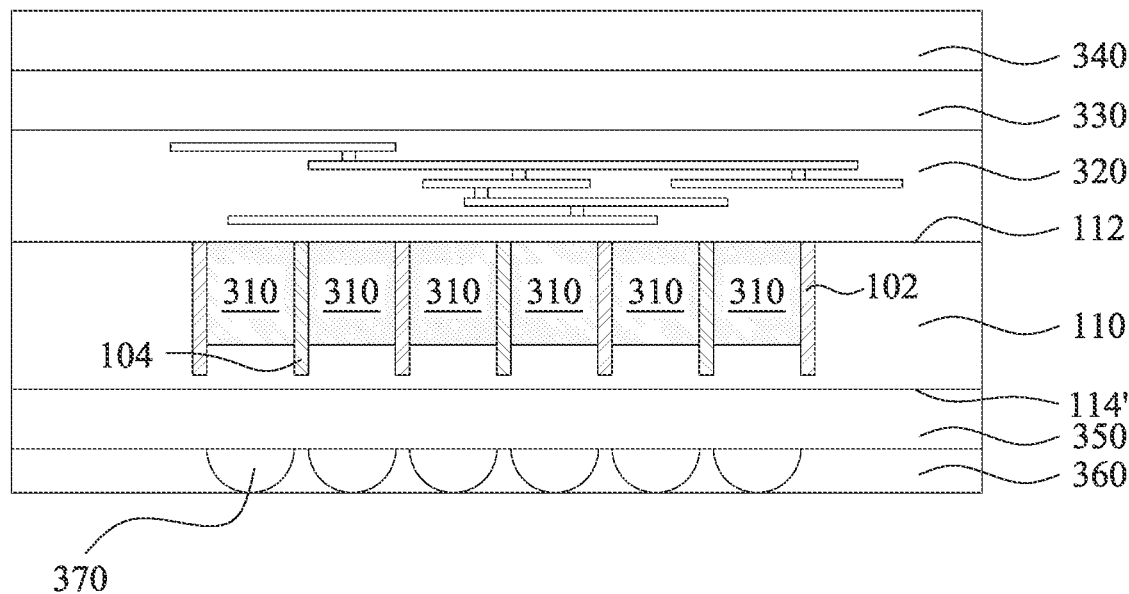
FIGS. 24A and 24B illustrate simplified cross-sectional views of an image sensor device in accordance with some embodiments.
Figure 24B:
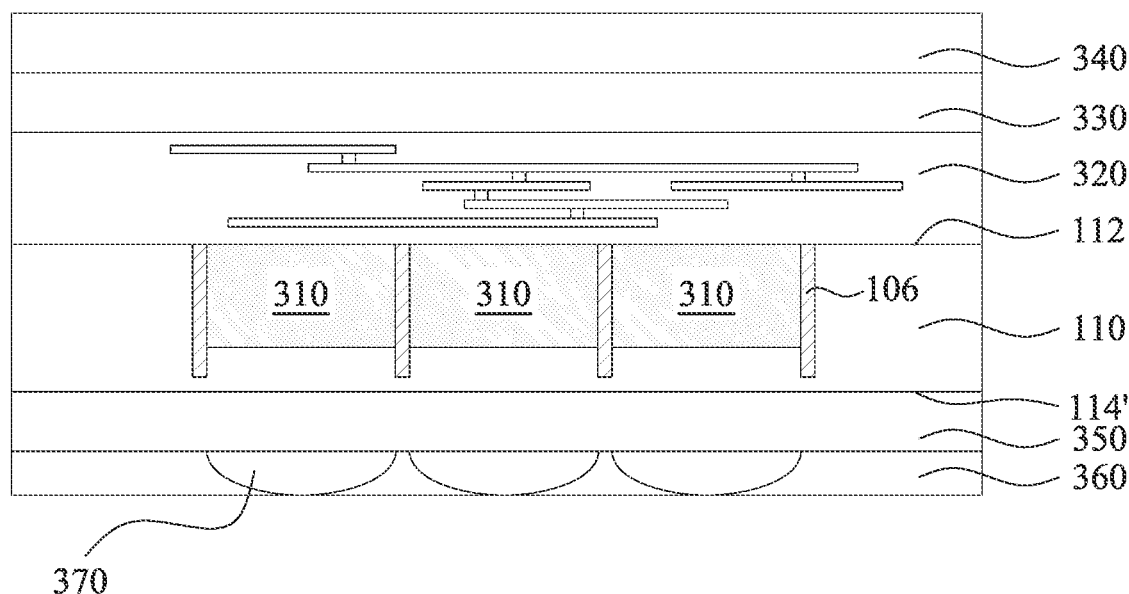

FIG. 23A illustrates a simplified top view for manufacturing an image sensor device 100 at various stages in accordance with some embodiments, and FIG. 23B is a cross-sectional view taken along line B-B in FIG. 23A. In some embodiments, the acts of blacks S24 and S24 are omitted. That is, fourth isolation regions are not formed in the device substrate 110. Therefore, each of the pixels 310 has a rectangular shape in a top view. Specifically, each of the pixels 310 has a length L3 and a width W17. The width W17 is defined by adjacent first and second isolation regions 102 and 104, and the length L3 is defined by adjacent two third isolation regions 106. The length L3 is greater than the width W17 and is above sub-micrometer levels. For example, the length L3 is greater than about 1 micrometer, such as about 1.15 micrometers to about 3 micrometers, for example about 1.2 micrometers to about 1.9 micrometers. The width W17 is at sub-micrometer level. For example, the width W17 is about 0.75 micrometers to about 0.95 micrometers. After the pixels 310 are formed, additional fabrication processes may be performed to complete the fabrication of the image sensor device 100 as shown in FIGS. 24A and 24B, where FIG. 24A has a cross-sectional position the same as FIG. 22B, and FIG. 24B has a cross-sectional position the same as FIG. 23B. Other relevant structural details of the image sensor device in FIGS. 24A and 24B are similar to the image sensor device in FIGS. 18A and 18B, and, therefore, a description in this regard will not be repeated hereinafter.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the photoresist columns are formed with low aspect ratio and ultrahigh aspect ratio trench between the photoresist columns without collapsing the photoresist columns. In addition, since the photoresist columns are formed with ultrahigh aspect ratio trench between the photoresist columns, deeper isolation regions can be achieved with limited implant damages to the image sensor device (e.g., isolation regions can be formed with minimum lateral diffusion) even if high implantation energies are used. As a result, the ions can be implanted deeper to provide an effective pixel-to-pixel isolation for the image sensor device. Furthermore, since the photoresist columns are substantially parallel lines spaced apart from each other, the formed pixels avoid corner rounding issues.

According to some embodiments, a method for manufacturing an image sensor device includes forming a first photoresist layer on a front side of a device substrate. The first photoresist layer has first trenches spaced apart from each other. A first implantation process is performed using the first photoresist layer as a mask to form first isolation regions in the device substrate. A second photoresist layer is formed on the front side of the device substrate. The second photoresist layer has second trenches spaced apart from each other. A second implantation process is performed using the second photoresist layer as a mask to form second isolation regions in the device substrate and crossing over the first isolation regions. A third photoresist layer is formed on the front side of the device substrate. The third photoresist layer has third trenches spaced apart from each other. A third implantation process is performed using the third photoresist layer as a mask to form third isolation regions in the device substrate and crossing over the first isolation regions but spaced apart from the second isolation regions.

According to some embodiments, a method for manufacturing an image sensor device includes performing a first lithography process using a first pattern of a first photomask to form a first photoresist pattern on a front side of a device substrate. The first pattern includes substantially parallel lines with a first pitch and arranged along a first direction. A first implantation process is performed using the first pattern as a mask to form first isolation regions in the device substrate. A second lithography process is performed using a second pattern of a second photomask to form a second photoresist pattern on the front side of the device substrate. The second pattern is shifted from the first pattern by a distance less than the first pitch and in the first direction. A second implantation process is performed using the second photoresist pattern as a mask to form second isolation regions in the device substrate and spaced apart from the first isolation regions. Pixels are formed between the first and second isolation regions.

According to some embodiments, an image sensor device includes a device substrate, isolation regions, and pixels. The isolation regions are in the device substrate and define pixel regions in the device substrate. The pixels are respectively in the pixel regions. Each of the pixels has a length and a width. The width is less than about 1 micrometer. Portions of the isolation regions at four corners of at least one of the pixels have doping concentrations greater than a doping concentration of another portion of the isolation regions on a sidewall of the at least one pixel.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming first photoresist columns on a device substrate, wherein the first photoresist columns are spaced apart from one another;
    applying a chemical mixture comprising surfactant particles and a chemical material to the first photoresist columns, wherein the surfactant particles and the chemical material comprise different compositions;
    after applying the chemical mixture to the first photoresist columns to the chemical mixture, performing a first implantation process to implant first ions into the device substrate to form first isolation regions in the device substrate using the first photoresist columns as a mask;
    performing a second implantation process to implant second ions into the device substrate to form second isolation regions, wherein the second isolation regions and the first isolation regions are staggered along a first direction from a top view; and
    forming pixels between the first and second isolation regions.

2. The method of claim 1, wherein the surfactant particles include a fluorinated compound.

3. The method of claim 1, wherein the chemical material is a polymer having a thermal cross-linking property.

4. The method of claim 1, further comprising:
    performing a baking process to the first photoresist columns such that the chemical material is cross-linked to the first photoresist columns and forms a cross-linking film on an exposed surface of the first photoresist columns.

5. The method of claim 1, wherein the surfactant particles have a micelle portion.

6. The method of claim 3, wherein the polymer is water-soluble.

7. The method of claim 4, further comprising:
    after performing the baking process, performing a developing process.

8. The method of claim 4, wherein forming the cross-linking film on the exposed surface of the first photoresist columns comprises:
    forming the cross-linking film on a top surface and opposite sidewalls of the first photoresist columns.

9. The method of claim 4, wherein forming the cross-linking film on the exposed surface of the first photoresist columns is performed such that a capillary force inside a trench between two of the first photoresist columns is reduced.

10. The method of claim 1, wherein applying the chemical mixture comprising the surfactant particles and the chemical material to the first photoresist columns is performed using a spin-coating process.

11. A method, comprising:
    forming first photoresist columns on a device substrate, wherein the first photoresist columns are parallel to each other;
    forming a polymer layer on one of the first photoresist columns;
    after forming the polymer layer, performing a first implantation process to implant first ions into the device substrate to form first isolation regions in the device substrate using the first photoresist columns as a mask;
    performing a second implantation process to implant second ions into the device substrate to form second isolation regions, wherein the second isolation regions and the first isolation regions are staggered along a first direction from a top view; and
    forming pixels between the first and second isolation regions.

12. The method of claim 11, wherein the polymer layer is a conformal layer.

13. The method of claim 11, wherein the polymer layer is in contact with opposite sidewalls of the one of the first photoresist columns.

14. The method of claim 11, wherein the polymer layer is in contact with a top surface of the one of the first photoresist columns.

15. The method of claim 11, wherein the polymer layer comprises surfactants disposed on a sidewall of the one of the first photoresist columns.

16. The method of claim 11, wherein the polymer layer is in contact with a top surface of the device substrate.

17. A method, comprising:
    forming first photoresist columns on a device substrate, wherein the first photoresist columns have the same height;
    forming a polymer layer on one of the first photoresist columns;

after forming the polymer layer, performing a first implantation process to implant first ions into the device substrate to form first isolation regions in the device substrate using the first photoresist columns as a mask;

performing a second implantation process to implant second ions into the device substrate to form second isolation regions, wherein the second isolation regions and the first isolation regions are staggered along a first direction from a top view; and forming pixels between the first and second isolation regions.

18. The method of claim 17, wherein the device substrate has a top surface uncovered by the first photoresist columns and the polymer layer.

19. The method of claim 17, wherein the first ions are n-type.

20. The method of claim 17, wherein the first ions are p-type.

* * * * *